United States Patent
Ishigaki

[11] Patent Number: 6,097,103
[45] Date of Patent: Aug. 1, 2000

[54] SEMICONDUCTOR DEVICE HAVING AN IMPROVED INTERCONNECTION AND METHOD FOR FABRICATING THE SAME

[75] Inventor: Yoshiyuki Ishigaki, Tokyo, Japan

[73] Assignee: Mitsubishi Denki Kabushiki Kaisha, Tokyo, Japan

[21] Appl. No.: 09/081,283

[22] Filed: May 20, 1998

[30] Foreign Application Priority Data

Nov. 28, 1997 [JP] Japan ................................. 9-328127

[51] Int. Cl.⁷ .................................................. H01L 27/11
[52] U.S. Cl. ......................... 257/903; 257/377; 257/775
[58] Field of Search .................................. 257/377, 903, 257/773, 775, 776

[56] References Cited

U.S. PATENT DOCUMENTS

| | | | |
|---|---|---|---|
| 5,294,822 | 3/1994 | Verrett | 257/368 |
| 5,640,037 | 6/1997 | Blanchard | 257/369 |
| 5,677,557 | 10/1997 | Wuu et al. | 257/382 |
| 5,682,052 | 10/1997 | Hodges et al. | 257/377 |
| 5,717,240 | 2/1998 | Kuriyama et al. | 257/370 |
| 5,821,590 | 10/1998 | Lee et al. | 257/377 |

FOREIGN PATENT DOCUMENTS 9-55440  2/1997  Japan .

*Primary Examiner*—Jerome Jackson, Jr.
*Assistant Examiner*—George C. Eckert, II
*Attorney, Agent, or Firm*—Oblon, Spivak, McClelland, Maier & Neustadt, P.C.

[57] ABSTRACT

$P^+$-type source/drain regions for load transistors and $N^+$-type source/drain regions for driver transistors are connected by means of $P^+$-type source/drain region outgoing lead and $N^+$-type source/drain region outgoing lead via direct contact holes. The drain region outgoing lead for the load transistors and ground lead are formed in a three-dimensionally overlapping manner, and the drain region outgoing lead for the driver transistors connected to memory nodes on one side and the drain region outgoing lead for the load transistors connected to memory nodes on the other side are also formed in a three-dimensionally overlapping manner, whereby memory node charge accumulators are constituted.

18 Claims, 16 Drawing Sheets

A1, A2: access transistor
D1, D2: driver transistor
N1, N2: memory node
P1, P2: load transistor
Q1, Q2, Q3: accumulated charge at memory node (=cxv)

A1, A2: access transistor
D1, D2: driver transistor
N1, N2: memory node
P1, P2: load transistor A1, A2: access transistor
D1, D2: driver transistor
N1, N2: memory node
X1, X2: diode
P1, P2: load transistor

SEMICONDUCTOR DEVICE HAVING AN IMPROVED INTERCONNECTION AND METHOD FOR FABRICATING THE SAME

FIELD OF THE INVENTION

The present invention relates to a semiconductor device and a method for fabricating the same. More specifically, the present invention relates to a semiconductor device having memory cells and a method for fabricating that semiconductor device.

BACKGROUND ART

Static random access memories (SRAMs) are one type of known volatile semiconductor memory device. The SRAM typically has memory cells formed at points of intersection between complementary data lines (bit lines) and word lines arranged in a matrix fashion. FIG. 32 is an equivalent circuit diagram showing a memory cell of a conventional SRAM. A typical circuit constitution of the SRAM will now be described with reference to FIG. 32.

A memory cell of the conventional SRAM comprises two access transistors A1 and A2, two driver transistors D1 and D2, and two load transistors P1 and P2. The two load transistors P1 and P2 and the two driver transistors D1 and D2 make up a flip-flop circuit. The flip-flop circuit constitutes two memory nodes N1 and N2 that are cross-coupled. The memory nodes N1 and N2 are in a bi-stable state involving one of two settings: either N1 is High and N2 Low, or N1 is Low and N2 High. The bi-stable state is maintained as long as power is supplied appropriately.

One source/drain region of each of the access transistors A1 and A2 is connected to the memory nodes N1 and N2 respectively, i.e., to input/output terminals of the flip-flop circuit. The other source/drain regions of the access transistors A1 and A2 are connected to bit lines. The gate electrodes of the access transistors A1 and A2 are connected to a word line. The word line controls the activation and deactivation of the access transistors A1 and A2.

The drain regions of the driver transistors D1 and D2 are connected to the source/drain regions on one side of the access transistors A1 and A2 respectively. The source regions of the driver transistors D1 and D2 are connected to ground (VEE line). The gate electrode of the driver transistor D1 is connected to the source/drain region of the access transistor A2, and the gate electrode of the driver transistor D2 is coupled to the source/drain region of the access transistor A1. The source/drain regions on one side of the load transistors P1 and P2 are connected to the source/drain regions on one side of the access transistors A1 and A2. The source/drain regions on the other side of the load transistors P1 and P2 are connected to power supply line (VCC line).

For a data write operation, the word line (WL) is selected so as to turn on the access transistors A1 and A2. A voltage is then forced onto the bit line pair in accordance with a desired logical value, whereby the flip-flop circuit has its bi-stable state brought into one of the two settings described above.

For a data read operation, the access transistors A1 and A2 are first turned on. Then a potential on the memory nodes N1 and N2 is transmitted to the bit lines.

Having the above-described constitution, so-called six-transistor type SRAM cells that use PMOSs as load transistors formed on a substrate are extensively practiced today (called full-CMOS type SRAM cells hereunder). In a full-CMOS type SRAM cell, the drain region ($P^+$diffusion region) of the PMOSs (load transistors) constituting one inverter of the flip-flop circuit needs to be connected to the drain region ($N^+$diffusion region) of the NMOSs (driver transistors).

Traditionally, full-CMOS type SRAM cells utilize metal lead providing ohmic contacts for interconnection, i.e., local lead that encompasses all lead arrangements connecting diffusion layers of transistors as well as contiguous elements. Illustratively, Japanese Patent Laid-Open No. Hei 9-55440 discloses a full-CMOS type SRAM that uses metal arrangements for lead. The disclosed semiconductor device has tungsten-embedded electrodes connecting metal lead layers to the substrate, and also has tungsten-embedded electrodes connecting contact holes that link contiguous elements.

Generally, metal lead has poor workability. Pattern pitches can be reduced to only a certain extent, so that it is difficult to achieve further miniaturization. Another disadvantage of metal lead in general is its poor resistance to heat. This limits the scope of thermal treatment following pattern formation.

One proposed solution to the above difficulties with conventional full-CMOS type SRAM cells involves the use of a polycrystal silicon film as lead that connects specifically the drain regions of PMOSs (load transistors) to those of NMOSs (driver transistors). However, the use of such a polycrystal silicon film in the conventional SRAM poses other problems, as will be described below.

FIGS. 33 and 34 are an equivalent circuit diagram and a cross-sectional view of the conventional SRAM respectively, both intended to explain problems therewith. In FIG. 34, reference numeral 51 is an $N^-$-type silicon substrate, 52 is a P-type well region, 53 is an N-type well region, and 54 is a field insulating film for isolating elements. Driver transistors are formed on the surface of the P-type well region 52 surrounded by the field insulating film 54. Each driver transistor is composed of $N^+$-type source/drain regions 55a and 55b, $N^-$-type source/drain regions 56a through 56c, a gate oxide film 58, a gate electrode 59a, and a side wall oxide film 60.

Load transistors are formed on the surface of the N-type well region 53 surrounded by the field insulating film 54. Each load transistor is made up of a $P^+$-type source/drain region 57, a gate oxide film 58, a gate electrode 59b, and a side wall oxide film 60. The entire surface is covered with a silicon dioxide film 61. Contact holes 62a and 62b are formed on the $N^+$-type source/drain region 55b of the driver transistor and on the $P^+$-type source/drain region 57 of the load transistor. A polycrystal silicon film 63 is formed inside the contact holes 62a and 62b as well as over the silicon dioxide film 61. The polycrystal silicon film 63 is a P-type polycrystal silicon film doped with P-type impurities such as boron. The P-type polycrystal silicon film connects the $N^+$-type source/drain region 55b of the driver transistor to the $P^+$-type source/drain region 57 of the load transistor.

It should be noted that transistor-to-transistor connection by means of single-layer lead leads to connecting the drain regions of PMOSs (load transistors) to those of NMOSs (driver transistors) through a conductive polycrystal silicon film. In the interconnection utilizing a single-layer polycrystal silicon film of the same conductivity, as shown in FIGS. 33 and 34, subsequent heat treatment causes the polycrystal silicon film to diffuse impurities into the silicon substrate. This leads to another problem: PN diodes are formed in the silicon substrate.

The PN diodes are produced because P-type impurities contained in the polycrystal silicon film 63 are diffused into the substrate, thereby generating a P⁺-type diffusion region 64 in the N⁺-type source/drain region 55b. This allows the High level of the memory nodes N1 and N2 to rise just up to VCC-Vbi (Vbi: built-in potential of PN junction ≈0.8 V), which tends to make the High level of the memory nodes unstable. With the High node level in such an unstable state, a drop in the resistance to so-called soft errors may become pronounced.

Soft errors can occur as follows: alpha rays upon entry from the outside such as the package material produce electron-hole pairs. Of these pairs, electrons are attracted to memory nodes in the memory cells and invert stored data in the cells, causing random errors called soft errors. When the High node level of the memory cells drops dragged by a falling potential accumulated therein, the resistance to such soft errors will deteriorate.

When the polycrystal silicon film connects the drain regions of PMOSs (load transistors) to those of NMOSs (driver transistors), the presence of PN diodes that may be formed in the silicon substrate and a high lead resistance of the silicon film itself combine to boost the resistance of connection between the drain regions of the PMOSs (load transistors) and those of the NMOSs (driver transistors). The enhanced connection resistance makes it difficult to supply charges to the memory nodes, reducing the accumulated charges in the High level nodes of the memory cells. This further promotes the possibility of causing soft errors.

Full-CMOS type SRAM cells are subject to another disadvantage: each cell must comprise two PMOSs and four NMOSs. That transistor layout requires the full-CMOS type SRAM cell to have a greater cell area than other types of SRAMs.

SUMMARY OF THE INVENTION

It is therefore an object of the present invention to overcome the above and other deficiencies and disadvantages of the conventional full-CMOS type SRAM cell and to provide a semiconductor device which permits further miniaturization of the size of its memory cells for large-scale circuit integration.

It is another object of the present invention to provide a semiconductor device which prevents diffusion of impurities from a single-layer polycrystal silicon film of the same conductivity into a silicon substrate when the silicon film connects PMOS drains to NMOS drains in order to forestall the formation of ideal PN diodes in the substrate, whereby the High level nodes of memory cells are stabilized and any deterioration in the resistance to soft errors is minimized.

It is a further object of the present invention to provide a semiconductor device which reduces the resistance of connection, conventionally promoted by a high lead resistance of a polycrystal silicon film, between PMOS drains and NMOS drains, and which increases the capacity of its memory nodes, whereby the High level nodes of the memory cells are stabilized and any deterioration in the resistance to soft errors is minimized.

It is an even further object of the present invention to provide a method for fabricating a semiconductor device which permits further miniaturization of the size of its memory cells for large-scale circuit integration while minimizing any deterioration in the resistance to soft errors.

According to one aspect of the present invention, a semiconductor device is provided which has a lead connection structure wherein at least two lead layers are electrically interconnected via contact holes. The semiconductor device comprises a semiconductor substrate having a principal plane, and a first and a second impurity region are formed on the principal plane of the semiconductor substrate. A first insulating film is formed on the semiconductor substrate and has a first through hole reaching a surface of the first impurity region. First lead is formed on the first insulating film and connected electrically via the first through hole to the first impurity region. A second insulating film is formed so as to cover the first lead. A second lead is formed on the second insulating film, and is electrically connected to the second impurity region via a second through hole penetrating the first insulating film, the first lead and the second insulating film. The interconnection of the first and the second impurity regions is accomplished by connecting the first lead, the second lead and the second impurity region inside the second through hole. Further, one of the first lead and the second lead is constituted by a polycrystal silicon film.

In the semiconductor device, the other one of the first lead and the second lead is preferably constituted by a polycrystal silicon film too.

In another aspect of the present invention, in the semiconductor, the first lead and the first impurity region have a p-type conductivity, and the second lead and the second impurity region have an n-type conductivity.

In another aspect of the present invention, the semiconductor device is a static random access memory comprising first and second load transistors, first and second driver transistors, and first and second access transistors. The first lead serves as drain region outgoing lead for the first and the second load transistors, and the second lead acts as drain region outgoing lead for the first and the second driver transistors.

In another aspect of the present invention, in the semiconductor device, the second lead includes ground lead besides serving as the drain region outgoing lead for the first and the second driver transistors, and the ground lead is fabricated on the second insulating film in the same process as that of the second lead. The drain region outgoing lead for the first and the second load transistors and the ground lead are formed in a three-dimensionally overlapping manner, with the second insulating film interposed therebetween. The drain region outgoing lead for the first load transistors and the drain region outgoing lead for the second driver transistors are formed in a three-dimensionally overlapping manner, with the second insulating film interposed therebetween.

In another aspect of the present invention, in the semiconductor device, the first lead includes power lead besides serving as the drain region outgoing lead for the first and the second load transistors, and the power lead is fabricated in the same process as that of the first lead. The power lead and the ground lead is formed in a three-dimensionally overlapping manner.

In another aspect of the present invention, in the semiconductor device, the first lead and the first impurity region have an n-type conductivity, and the second lead and the second impurity region have a p-type conductivity.

In another aspect of the present invention, the semiconductor device is a static random access memory comprising first and second load transistors, first and second driver transistors, and first and second access transistors. The first lead serves as drain region outgoing lead for the first and the second driver transistors, and the second lead acts as drain region outgoing lead for the first and the second load transistors.

In another aspect of the present invention, in the semiconductor device, the first lead includes ground lead besides serving as the drain region outgoing lead for the first and the second driver transistors, and the ground lead is fabricated on the first insulating film in the same process as that of the first lead. The ground lead and the drain region outgoing lead for the first and the second load transistors are formed in a three-dimensionally overlapping manner, with the second insulating film interposed therebetween. The drain region outgoing lead for the second driver transistors and the drain region outgoing lead for the first load transistors are formed in a three-dimensionally overlapping manner, with the second insulating film interposed therebetween.

In another aspect of the present invention, in the semiconductor device, the second lead includes power lead besides serving as the drain region outgoing lead for the first and the second load transistors, and the power lead is fabricated in the same process as that of the second lead. The power lead and the ground lead re formed in a three-dimensionally overlapping manner.

Other and further objects, features and advantages of the invention will appear more fully from the following description.

BRIEF DESCRIPTION OF THE DRAWINGS

FIGS. 5, 7 and 9 are a plan layout view of a memory cell each. FIGS. 6, 8 and 10 are cross-sectional views taken on line VI—VI, VII—VII and VIII—VIII in the respectively preceding layout views.

FIGS. 13, 15 and 17 are a plan layout view of a memory cell each. FIGS. 14, 16 and 18 are cross-sectional views taken on line XIV—XIV, XVI—XVI and XVIII—XVIII in the respectively preceding layout views.

BEST MODE OF CARRYING OUT THE INVENTION

Preferred embodiments of the present invention will be described below with reference to the accompanying drawings.

First Embodiment

Figure 1:
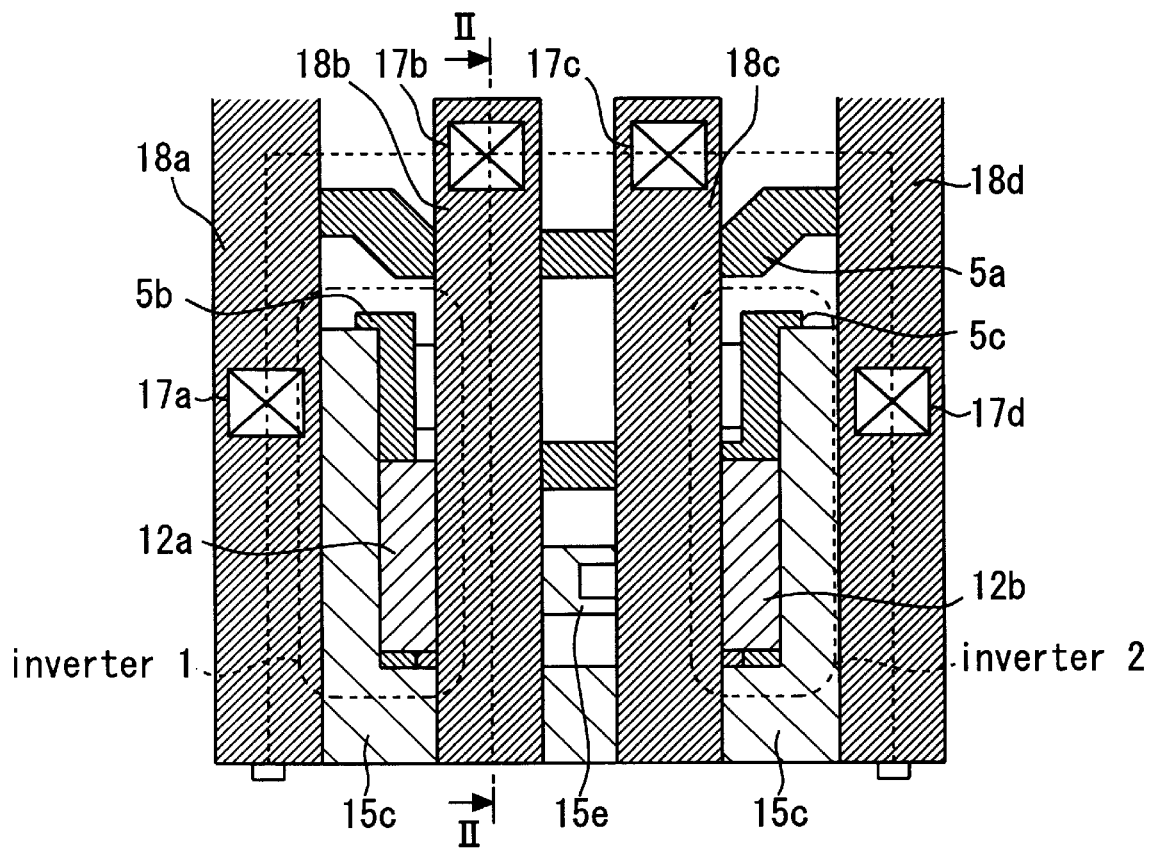
FIG. 1 is a plan layout view of a memory cell in an SRAM practiced as a first embodiment of the present invention.
Figure 2:
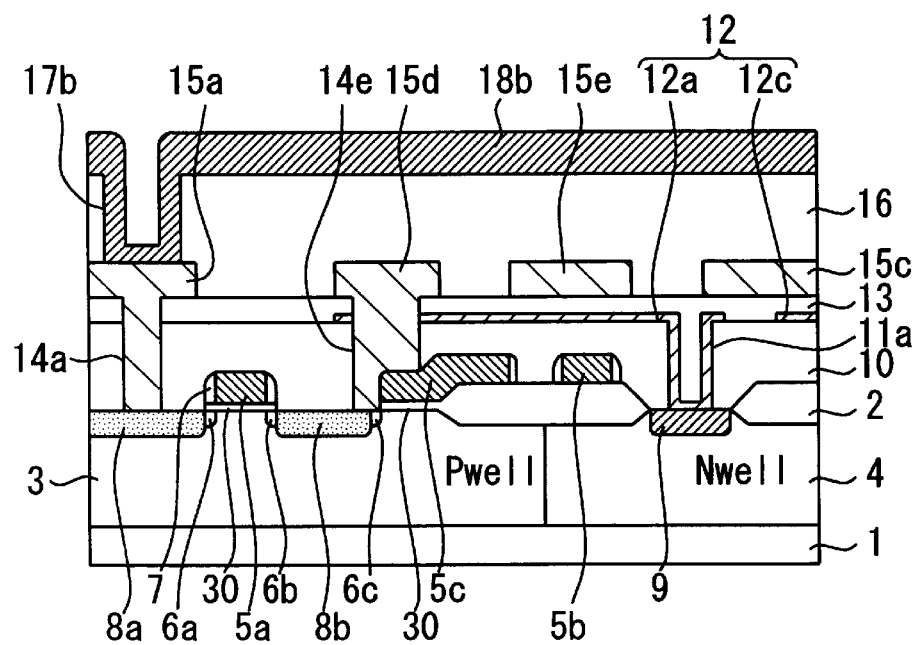
FIG. 2 is a cross-sectional view taken on line II—II in FIG. 1.

FIG. 1 is a plan layout view of a memory cell in an SRAM practiced as a first embodiment of the present invention. FIG. 2 is a cross-sectional view taken on line II—II in FIG. 1. A typical memory cell in the SRAM constituting the first embodiment will now be described in terms of its cross-sectional structure with reference to FIG. 2.

One memory cell in the first embodiment has a $P^-$-type well region 3 and an $N^-$-type well region 4 formed on the surface of an $N^-$-type silicon substrate 1. In order to separate circuit elements, a field insulating film 2 is formed where appropriate on the surface of the $P^-$-type well region 3 and $N^-$-type well region 4. A $P^+$-type source/drain region 9 is formed on that surface of the $N^-$-type well region 4 which is surrounded by the field insulating film 2. On the surface of the $P^-$-type well region 3, $N^+$-type source/drain regions 8a and 8b are formed a predetermined distance apart. $N^-$-type source/drain regions 6a through 6c are furnished on both sides of the $N^+$-type source/drain regions 8a and 8b. The $N^-$-type source/drain regions 6a through 6c and $N^+$-type source/drain regions 8a and 8b constitute source/drain regions of an LDD (lightly doped drain) structure.

A gate electrode 5a of an access transistor is formed together with an interposing gate insulating film 30 on a channel region located between the $N^+$-type source/drain regions 8a and 8b. A leader 5c ranging from a second inverter to a first inverter is formed over the $P^-$-type well region 3 and field insulating film 2 with a gate oxide film 30 interposed therebetween. The first and the second inverters are constituted by a driver transistor and a load transistor each. Another leader 5b going from the first inverter to the second inverter is formed on the field insulating film 2 of the $N^-$-type well region 4.

A first-layer polycrystal silicon film constitutes the gate electrode 5a (which is a word line in FIG. 1) of the access transistor as well as the leaders 5b and 5c (which make up gate electrode lead for the driver and load transistors in FIG. 1). On the side surface of the first-layer polycrystal silicon film is a side wall oxide film 7. The entire surface is covered with a silicon dioxide film 10. Contact holes 11a through 11d are formed where appropriate on the silicon dioxide film 10.

A second-layer polycrystal silicon film is formed on the silicon dioxide film 10 on which the contact holes 11a through 11d are made. The second-layer polycrystal silicon film is a P-type polycrystal silicon film doped with P-type impurities such as boron (B). This polycrystal silicon film constitutes a $P^+$-type source/drain region outgoing lead 12a that contacts the $P^+$-type source/drain region 9. The $P^+$-type source/drain region outgoing lead 12a is also formed (indicated by reference numeral 12b) on the second inverter. Furthermore, VCC lead 12c is formed on the silicon dioxide film 10.

A silicon dioxide film 13 is formed so as to top the $P^+$-type source/drain region outgoing lead 12a, VCC lead 12c and silicon dioxide film 10. Direct contact holes 14a through 14g are made on the silicon dioxide film 13, on part of the P$^+$-type source/drain region outgoing lead 12a, and on the silicon dioxide film 10. A third-layer polycrystal silicon film is furnished so as to fill the direct contact holes 14a through 14g. The third-layer polycrystal silicon film is doped with phosphorus (N-type impurities).

Bit line contact pads 15a and 15b are first formed to fill the direct contact holes 14a and 14b. Reference numeral 15c represents ground lead, and 15d and 15e denote N$^+$-type source/drain region outgoing lead. The N$^+$-type source/drain region outgoing lead 15d interconnects the N$^+$-type source/drain region 8b, N$^-$-type source/drain region 6c, leader 5c, and P$^+$-type source/drain region outgoing lead 12a.

An interlayer insulating film 16 is formed so as to cover the elements 15a through 15e formed by the silicon dioxide film 13 and by the third-layer polycrystal silicon film. A bit line contact hole 17b is made in that location of the interlayer insulating film 16 which is positioned above the bit line contact pad 14a. A bit line 18b is formed so as to contact electrically the bit line contact pad 15a inside the bit contact hole 17b and to extend over the upper surface of the interlayer insulating film 16.

The bit line 18b is constituted by metal lead illustratively made of aluminum. Although FIG. 2 shows only one bit line 18b, there is in practice another bit line 18c paired with the bit line 18b inside each memory cell, the two lines extending parallelly and furnished a predetermined distance apart, as depicted in FIG. 1. The same metal lead as that of the bit lines 18b and 18c is used to form ground lines 18a and 18d.

As described, each memory cell in the SRAM practiced as the first embodiment utilizes a two-layer polycrystal silicon film structure to connect the P$^+$-type source/drain region 9 (for load transistors) with the N$^+$-type source/drain region 8b (for driver transistors). The two-layer structure provides reliable, heat-resistant interconnection, and permits easier patterning than the metal lead counterpart. The latter characteristic promises further miniaturization of memory cells leading to implementation of a semiconductor device capable of greater circuit integration than before.

Major features of memory cells constituting the first embodiment are described below, with reference to FIGS. 5 through 10 where necessary. These figures are later used to describe the process of fabricating the first embodiment.

Figure 9:
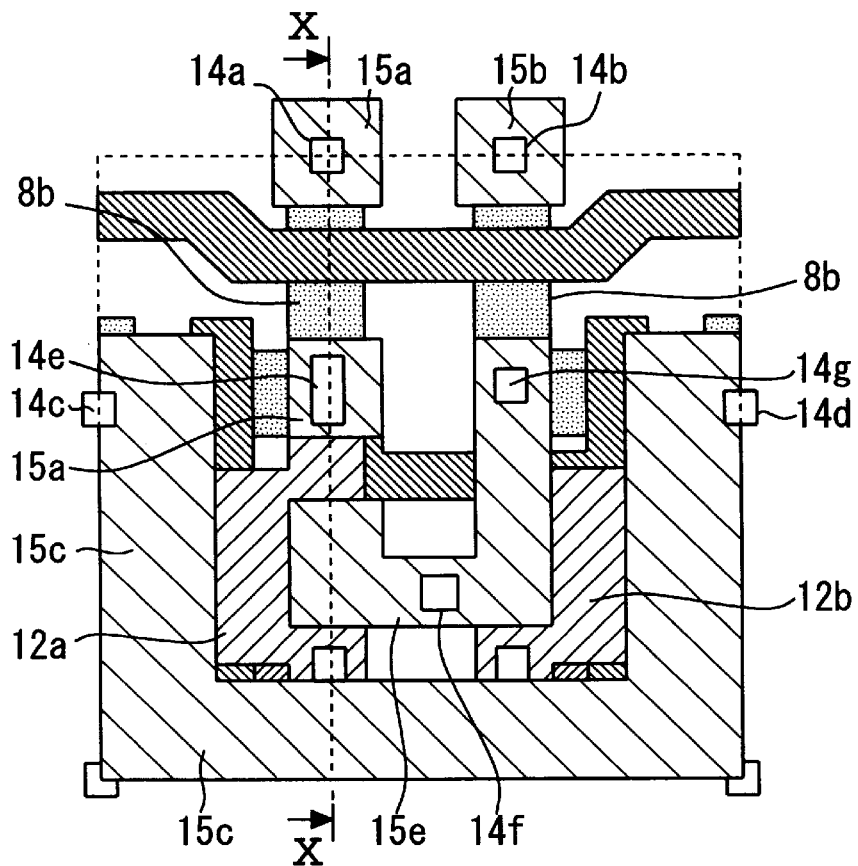

In a typical memory cell of the first embodiment, as shown in FIG. 9, the P$^+$-type source/drain region outgoing lead 12a (i.e., second-layer polycrystal silicon film) and ground lead 15c (third-layer polycrystal silicon film) are formed in a three-dimensionally overlapping manner. This structure constitutes a memory node charge accumulator Q1 shown in an equivalent circuit of the SRAM cell in FIG. 3, whereby the memory node capacity is increased.

The P$^+$-type source/drain region outgoing lead 12b and ground lead 15c are formed in a three-dimensionally overlapping manner, as illustrated in FIG. 9. This structure makes up a memory node charge accumulator Q2 shown in the SRAM cell equivalent circuit of FIG. 3, whereby the memory node capacity is boosted. Also as depicted in FIG. 9, the P$^+$-type source/drain region outgoing lead 12a and N$^+$-type source/drain region outgoing lead 15e are formed in a three-dimensionally overlapping manner. This arrangement forms a memory node charge accumulator Q3 shown in the SRAM equivalent circuit of FIG. 3, whereby the memory node capacity is raised.

Figure 3:
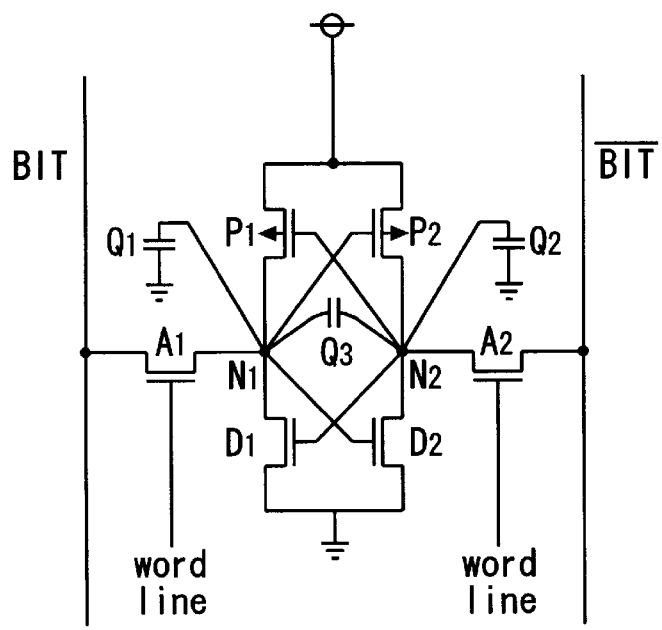
FIG. 3 shows an equivalent circuit of the SRAM cell in FIG. 3.

The above arrangements shown in FIG. 3 increase the memory node capacitance levels Q1 through Q3 in the SRAM cell equivalent circuit. Because the High level of the memory nodes is maintained in a stable fashion, the resistance to soft errors is improved significantly. This resolves the conventionally experienced problem of soft error resistance deterioration. Such deterioration in the resistance to soft errors has occurred where the PMOS and NMOS drains connected by a polycrystal silicon film structure generate high levels of connection resistance (of several kilohms to several megohms) aided by a high lead resistance of the polycrystal silicon film itself. The high connection resistance in turn hampers the supply of electrical charges to memory nodes. With less charges accumulated in the High nodes of the memory cells, the High nodes become unstable resulting in the soft error resistance deterioration.

Figure 33:
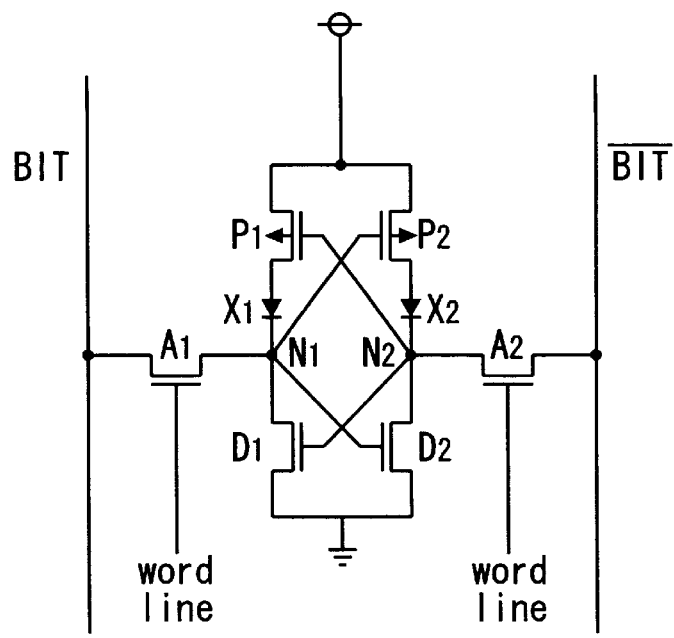
FIGS. 33 and 34 are an equivalent circuit diagram and a cross-sectional view of the conventional SRAM respectively.
Figure 34:
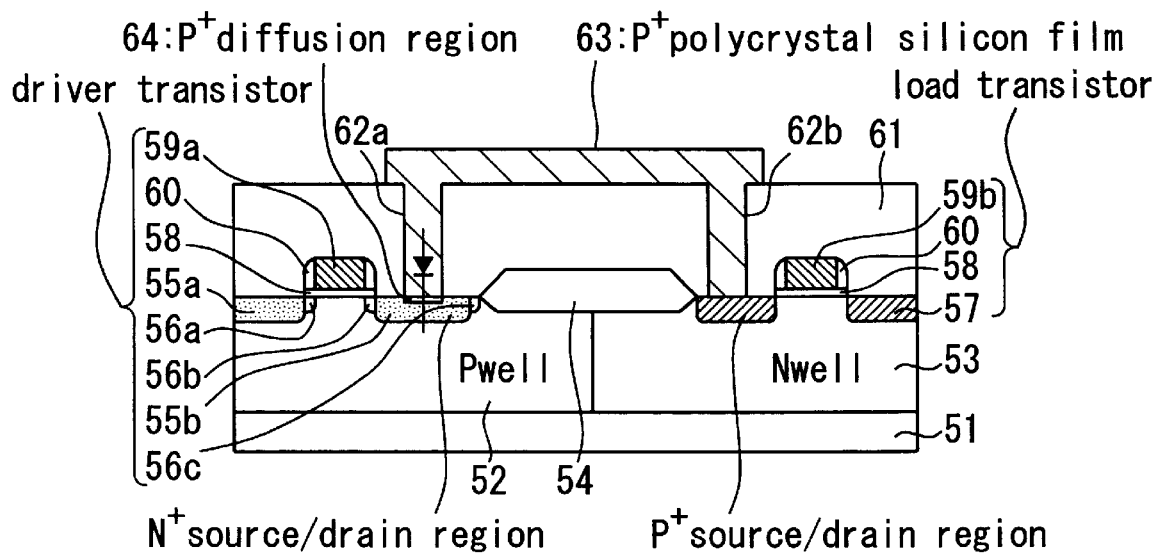

As illustrated in FIGS. 33 and 34, the conventional semiconductor device has another problem. When a single-layer P-type polycrystal silicon film of a given conductivity is used to interconnect the P$^+$-type source/drain region 57 for the load transistor and the N$^+$-type source/drain region 55b for the driver transistor, impurities diffused from the P-type polycrystal silicon film 63 can produce P$^+$-type diffusion regions 64 inside the N$^+$-type source/drain region 55b, thereby constituting ideal PN diodes in the silicon substrate. The PN diodes, when thus formed, allow the High level of the memory nodes N1 and N2 to rise just up to VCC-Vbi (Vbi: built-in potential of PN junction≈0.8 V), which tends to make the High level of the memory nodes unstable. With the High node level in such an unstable state, a drop in the resistance to soft errors can become significant.

By contrast, the memory cells of the SRAM embodying the invention have PN diodes formed by the P-type polycrystal silicon film (second-layer polycrystal silicon film) and N-type polycrystal silicon film (third-layer polycrystal silicon film). This structure helps increase leak currents thanks to the presence of electron traps, hole traps and neutral traps produced in grain boundaries, whereby the connection resistance is lowered as shown in FIG. 4.

Figure 4:
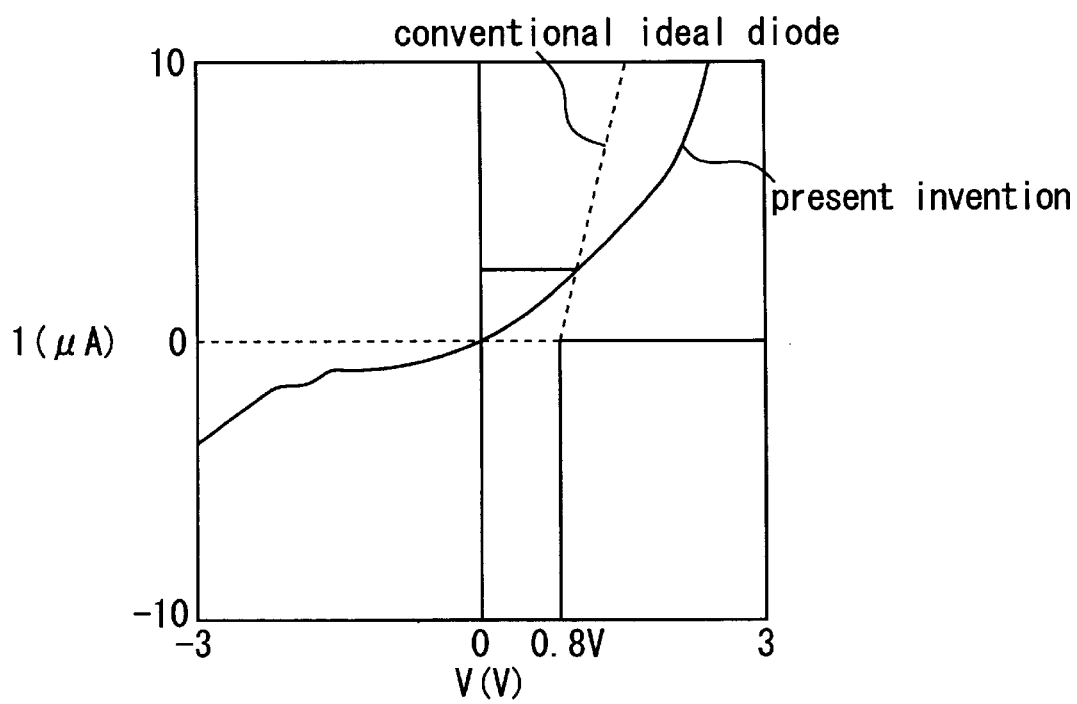
FIG. 4 is a graphic representation of effects provided by the SRAM practiced as the first embodiment of the present invention.

FIG. 4 is a graphic representation of effects provided by the SRAM practiced as the first embodiment. In FIG. 4, the axis of abscissa stands for voltages and the axis of ordinate for currents. In this conventional SRAM having ideal diodes formed in its silicon substrate, a forward current so small that it barely appears in the graph of FIG. 4 flows below the built-in potential level (0.8 V). With the first embodiment, by contrast, currents flow below the built-in potential (0.8 V) so that the connection resistance is reduced and the supply of charges to memory nodes is facilitated. This in turn stabilizes the memory nodes at the High level, which improves the resistance to soft errors.

In the memory cell of the first embodiment, as shown in FIG. 9, the direct contact hole 14e interconnects the N$^+$-type source/drain region outgoing lead 15d, the P$^+$-type source/drain region outgoing lead 12a, the N$^+$-type source/drain region 8b, and the leader 5c ranging from the second inverter to the first inverter, each converter being made of a driver transistor and a load transistor. This structure allows many lead layers to be connected in a narrow area with a minimum increase of process steps, implementing a semiconductor device capable of greater circuit integration than before.

Figure 7:
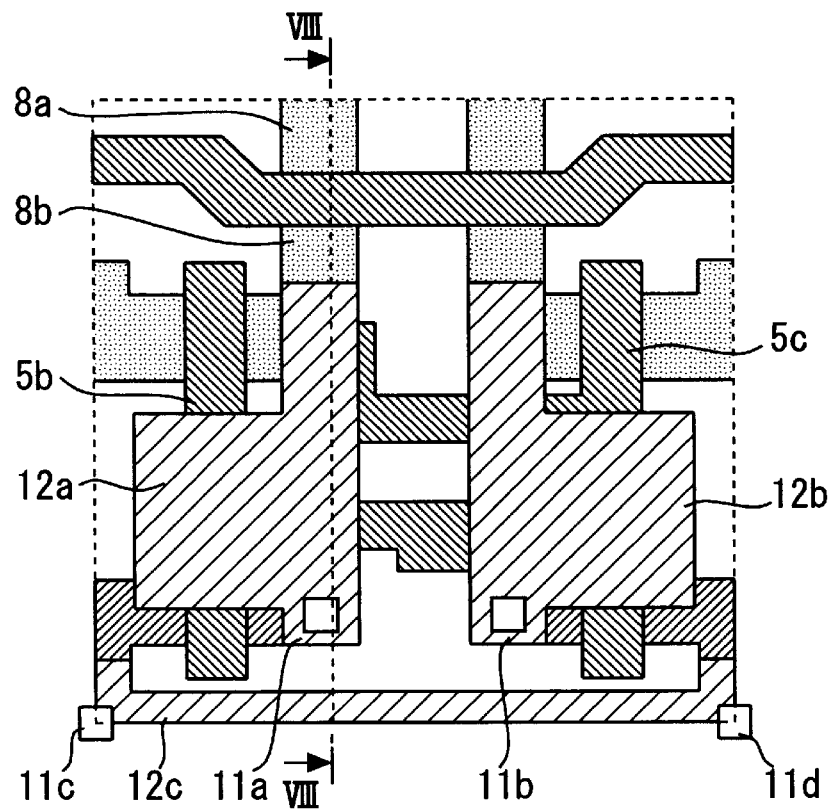

As shown in FIGS. 7 and 9, the VCC lead 12c is formed by the second-layer polycrystal silicon film and the ground lead 15c by the third-layer polycrystal silicon film. Because the VCC lead 12c and ground lead 15c are each made of a different layer and are formed in an overlapping manner, they take up less area than if they were formed by the same lead layer. This is another feature conducive to implementing a semiconductor device capable of large-scale circuit integration.

Figure 5:
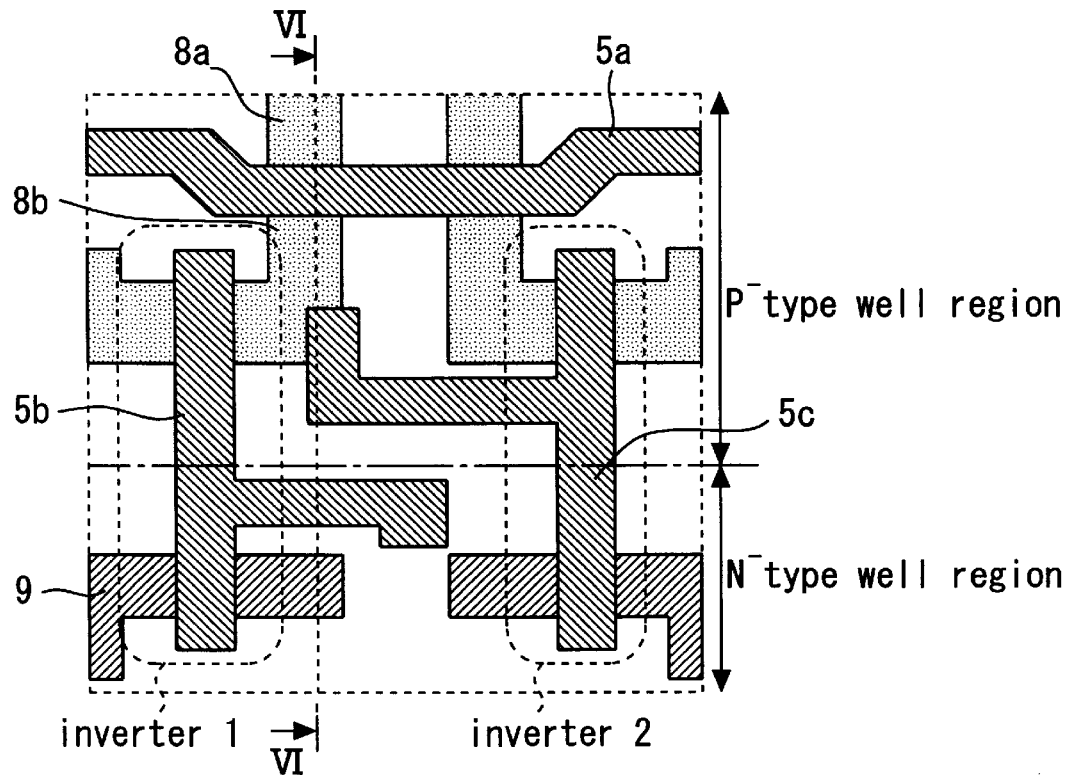
FIGS. 5 through 10 show a process of fabricating memory cells in the SRAM practiced as the first embodiment of the present invention.
Figure 6:
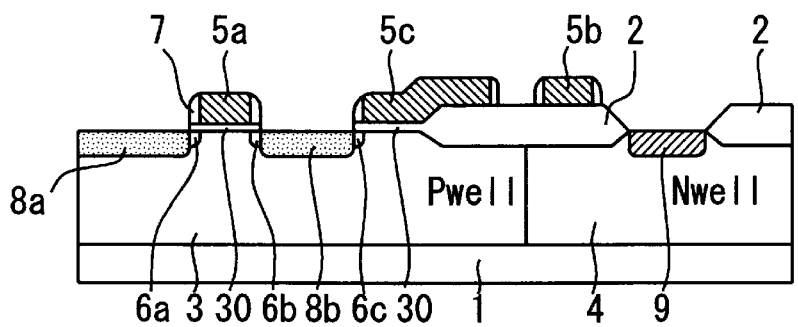
Figure 8:
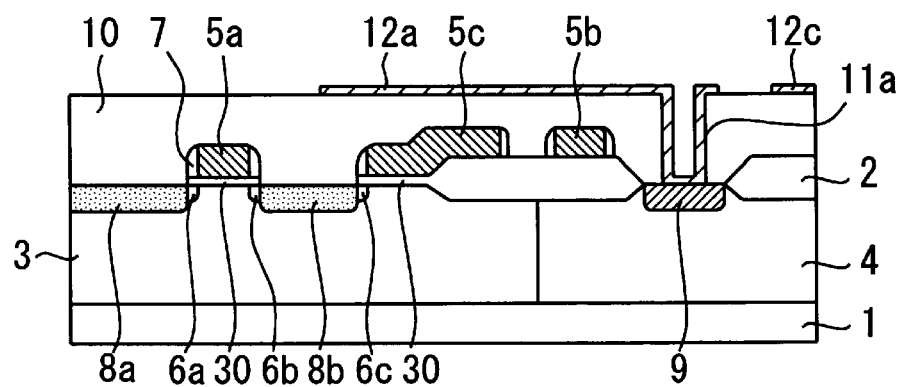
Figure 10:
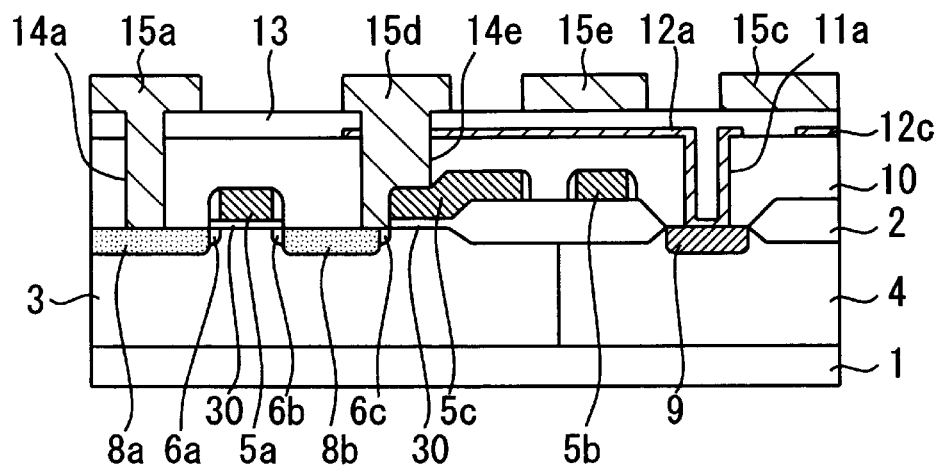

The process of fabricating memory cells in the SRAM practiced as the first embodiment will now be described with reference to FIGS. 5 through 10. FIGS. 5, 7 and 9 are a plan layout view of a memory cell each. FIGS. 6, 8 and 10 are cross-sectional views taken on line A—A in the respectively preceding layout views.

As shown in FIGS. 5 and 9, a field insulating film 2 made of an $SiO_2$ film and having a thickness of about 2000 to 5000 is first formed on an $N^-$-type silicon substrate 1 illustratively by the LOCOS (local oxidation of silicon) process. Specifically, an $Si_3N_4$ film is deposited on an $SiO_2$ film (not shown) used as a pad film. The $Si_3N_4$ film is used as an oxidation-resistant mask subject to selective thermal oxidation whereby the field insulating film 2 is formed.

The $SiO_2$ film (i.e., pad film) and $Si_3N_4$ film are subsequently removed to expose a semiconductor layer on the $N^-$-type substrate 1. Following exposure of the semiconductor layer, P-type impurities such as boron (B) are implanted onto all over the principal plane of the $N^-$-type silicon substrate 1 illustratively in doses of about $1\times10^{12}$ to $3\times10^{13}$ cm$^{-2}$ at 200 to 700 KeV. A threshold voltage (Vth) for the access and driver transistors is then established by implanting P-type impurities such as boron (B) illustratively in doses of $1\times10^{12}$ to $2\times10^{13}$ cm$^{-2}$ at 30 to 70 KeV. These steps form a $P^-$-type well region 3 having an impurity density of about $10^{16}$ to $10^{18}$/cm$^3$ on the principal plane of the $N^-$-type silicon substrate 1.

Similarly, N-type impurities such as phosphorus (P) are implanted onto the entire principal plane of the $N^-$-type silicon substrate 1 illustratively in doses of $1\times10^{12}$ to $3\times10^{13}$ cm$^{-2}$ at 700 to 1,500 KeV. A threshold voltage (Vth) for the load transistors is then established by implanting P-type impurities such as boron (B) illustratively in doses of $1\times10^{12}$ to $2\times10^{13}$ cm$^{-2}$ at 10 to 50 KeV. These steps produce an $N^-$-type well region 4 having an impurity density of about $10^{16}$ to $10^{18}$/cm$^3$ on the principal plane of the $N^-$-type silicon substrate 1.

The entire surface of the $N^-$-type silicon substrate 1 is thermally oxidized to form a gate insulating film (not shown) made of an $SiO_2$ film and having a film thickness of about 40 to 100 Å. On this gate insulating film, a phosphorus-doped polycrystal silicon film having a density of 10 to $10^{20}$ cm$^{-3}$ and having a thickness of about 500 to 2000 Å is deposited by the LPCVD (low pressure chemical vapor deposition) process using illustratively phosphine ($PH_3$) gas. The phosphorus-doped polycrystal silicon film constitutes the first-layer polycrystal silicon film.

The phosphorus-doped polycrystal silicon film and the gate insulating film underneath are patterned by photolithography and reactive ion etching (RIE). This forms a word line 5a, gate electrode leads 5b and 5c for the driver and load transistors, and a gate oxide film 30 as illustrated in FIG. 5.

The gate electrodes for the driver and load transistors are not shown in any cross-sectional views of the embodiment. In each cross-sectional view of this embodiment, reference numeral 5b stands for a leader ranging from a first inverter made of a driver transistor and a load transistor to the paired node (second inverter), and 5c for a leader going from the second inverter also composed of a driver transistor and a load transistor to the paired node (first inverter).

The first-layer polycrystal silicon film may alternatively be constituted by what is known as polycide lead made of a metal silicide film such as a tungsten silicide ($WSi_2$) film and of a phosphorus-doped polycrystal silicon film. This first-layer polycrystal silicon film has a sheet resistance of about 10 to 100 Ω/□.

With the word line 5a and the leaders 5b and 5c used as a mask as shown in FIG. 6, arsenic (As) is illustratively implanted where appropriate onto the $P^-$-type well region 3 in doses of about 1.0 to $5.0\times10^{13}$ cm$^{-2}$ at 30 to 70 KeV at an angle of 45 degrees as the wafer is rotated. This produces $N^-$-type source/drain regions 6a through 6c having an impurity density of about $10^{17}$ to $10^{19}$/cm$^3$.

An $SiO_2$ film (not shown) is deposited to a thickness of about 500 to 2000 Å over the entire surface by use of the LPCVD process. The $SiO_2$ film is then subjected to anisotropic etching. This forms a side wall oxide film 7 about 500 to 2000 Å wide on the side of the word line 5a as well as the leaders 5b and 5c.

With the word line 5a, side wall oxide film 7, leader 5c and side wall oxide film 7 used as a mask, arsenic (As) is illustratively implanted onto the principal plane of the $P^-$-type well region 3 in doses of about 1.0 to $5.0\times10^{15}$ cm$^{-2}$ at 50 KeV. This produces $N^+$-type source/drain regions 8a and 8b having an impurity density of about $10^{20}$ to $10^{21}$/cm$^3$. These steps combine to form a source/drain arrangement of an LDD (lightly doped drain) structure comprising the low-density $N^-$-type source/drain regions 6a through 6c and the high-density $N^+$-type source/drain regions 8a and 8b.

Furthermore, $BF_2$ is illustratively implanted onto the principal plane of the $N^-$-type well region 4 in doses of about 1.0 to $5.0\times10^{15}$ cm$^{-2}$ at 20 KeV. This produces a $P^+$-type source/drain region 9 having an impurity density of about $10^{20}$ to $10^{21}$/cm$^3$.

Then as shown in FIGS. 7 and 8, the entire surface is covered with a silicon dioxide film 10 about 1000 to 10,000 Å thick by use of the LPCVD process. Selective removal of parts of the silicon dioxide film 10 by photolithography and RIE (reactive ion etching) forms contact holes 11a through 11d partially exposing the $P^+$-type source/drain region 9. A natural oxide film formed over the top surface of the exposed $P^+$-type source/drain region 9 is removed illustratively by employing hydrofluoric acid (HF).

A second-layer polycrystal silicon film about 200 to 1000 Å thick is then deposited by LPCVD and patterned by photolithography and RIE. After the patterning, $BF_2$ is illustratively implanted onto all over the second-layer polycrystal silicon films 12a, 12b and 12c in doses of about $1.0\times10^{14}$ cm$^{-2}$ to $5.0\times10^{15}$ cm$^{-2}$ at 20 KeV. Thereafter, a lamp annealing process is typically used to activate boron in the second-layer polycrystal silicon films 12a through 12c.

The process causes the second-layer polycrystal silicon layers 12a through 12c to develop a sheet resistance of about 0.1 K to 100 KΩ/□. The polycrystal silicon films 12a and 12b constitute $P^+$-type source/drain region outgoing lead, and the polycrystal silicon film 12c makes up VCC lead.

As shown in FIGS. 9 and 10, the LPCVD process is then used to deposit a silicon dioxide film 13 about 100 to 1000 Å thick. The film is subjected to photolithography and RIE to form direct contact holes 14a through 14g. The direct contact hole 14e is made so as to penetrate the $P^+$-type source/drain region outgoing lead 12a under the film 13, partially exposing the $N^+$-type source/drain region 8b and the leader 5c composed of the first-layer polycrystal silicon film.

The direct contact hole 14g is formed so as to penetrate the $P^+$-type source/drain region outgoing lead 12b under the silicon dioxide film 13, exposing the $N^+$-type source/drain region 8b.

A natural oxide film formed over the exposed surface of, say, the $N^+$-type source/drain region 8b inside the direct contact holes 14a through 14g is removed using hydrofluoric acid (HF) or the like.

The LPCVD process is then used to form a phosphorus-doped polycrystal silicon film (not shown) constituting a third-layer polycrystal silicon film. The phosphorus-doped polycrystal silicon film is produced so that it has a thickness of about 1,000 to 2,000 Å and a phosphorus (P) density of about 1.0 to $8.0 \times 10^{20}$ cm$^{-3}$. The phosphorus-doped polycrystal silicon film is later patterned by photolithography and RIE, whereby bit line contact pads 15a and 15b, ground lead 15c, and N$^+$-type source/drain region outgoing lead 15d and 15e are formed. The third-layer polycrystal silicon film has a sheet resistance of about 10 to 100 Ω/□.

As a result, the direct contact hole 14e interconnects the N$^+$-type source/drain outgoing electrode 15d, P$^+$-type source/drain outgoing electrode 12a, N$^+$-type source/drain region 8b, and the leader 5c made of the first-layer polycrystal silicon film.

The direct contact hole 14g interconnects the N$^+$-type source/drain region outgoing lead 15e, P$^+$-type source/drain region outgoing lead 12b, and N$^+$-type source/drain region 8b.

In the first embodiment, the third-layer polycrystal silicon film is constituted by the phosphorus-doped polycrystal silicon film alone. However, this is not limitative of the invention. Alternatively, the film may be composed of what is known as polycide lead made of metal silicide such as a tungsten silicide (WSi2) film and of a phosphorus-doped polycrystal silicon film.

Thereafter, as indicated in FIGS. 1 and 2, the LPCVD process is used to form an interlayer insulating film 16 by depositing an SiO$_2$ film about 3,000 to 10,000 Å thick over the entire surface. Contact holes 17a and 17d, and bit line contact holes 17b and 17c are formed on the film thus produced. As metal lead, there is formed illustratively an aluminum film about 1,000 to 5,000 Å thick constituting ground lines 18a and 18d as well as bit lines 18b and 18c. The metal lead has a sheet resistance of about 0.05 to 1 Ω/□.

The processing above completes fabrication of the memory cells in the SRAM practiced as the first embodiment of the invention.

The silicon dioxide (SiO$_2$) film 13 used in the first embodiment may be replaced by a two-layer film composed of a silicon nitride film (Si$_3$N$_4$ film) and a silicon dioxide film (SiO$_2$ or SiON film). The alternative structure constitutes a dielectric film comprising the silicon nitride film and silicon dioxide film. The dielectric film is not limited to the two-layer film combining the Si$_3$N$_4$ film with the SiO$_2$ film. Alternatively, the dielectric film may be a single-layer film made of an Si$_3$N$_4$ film. The dielectric film may otherwise be a composite film constituted by an SiO$_2$ film, an Si$_3$N$_4$ film and an SiO$_2$ film; or any other highly dielectric film having a high dielectric constant.

Second Embodiment

Figure 11:
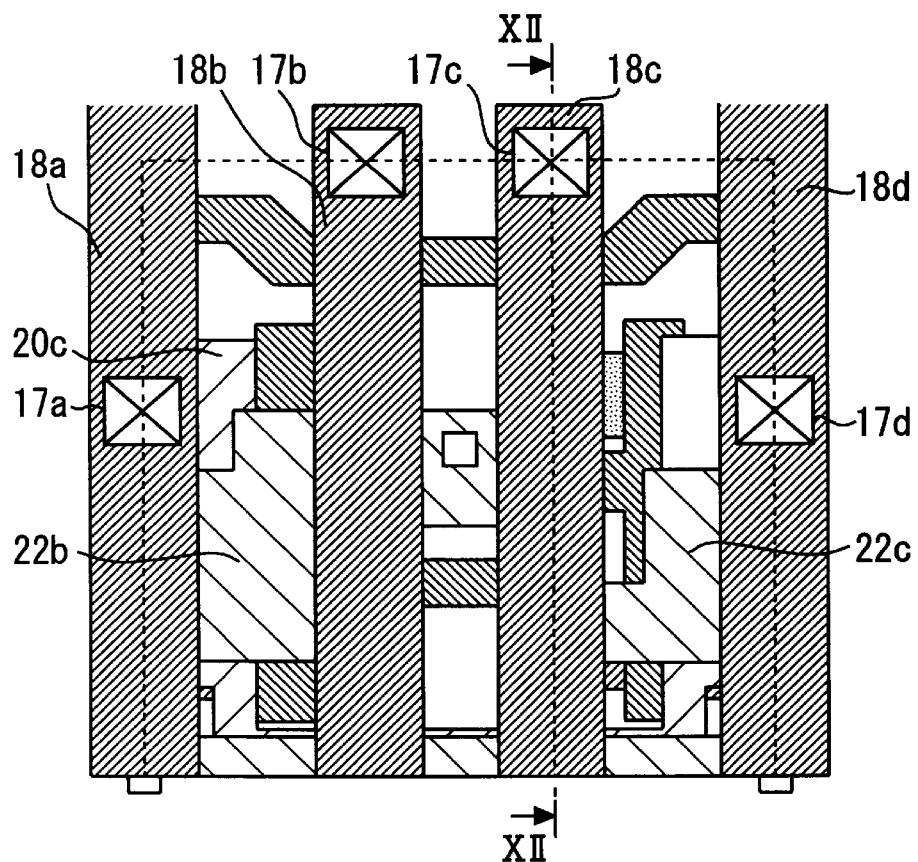
FIG. 11 is a plan layout view of a memory cell in an SRAM practiced as a second embodiment of the invention.
Figure 12:
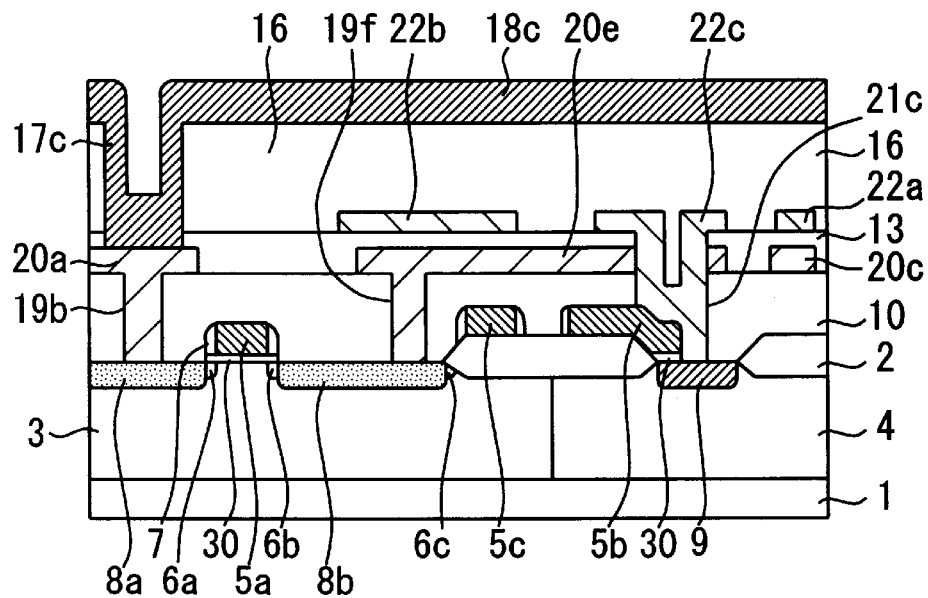
FIG. 12 is a cross-sectional view taken on line XI–XII in FIG. 11.

FIG. 11 is a plan layout view of a memory cell in an SRAM practiced as a second embodiment of the invention. FIG. 12 is a cross-sectional view taken on line XII—XII in FIG. 11. A typical memory cell in the SRAM constituting the second embodiment will now be described in terms of its cross-sectional structure with reference to FIG. 12. The second embodiment is basically the same in constitution as the first embodiment of FIG. 2 up to the formation of the first-layer polycrystal silicon film. Differing from the first embodiment, the second embodiment has a second-layer polycrystal silicon film constituting an N-type polycrystal silicon film connected to the N$^+$-type source/drain region 8b, and has a third-layer polycrystal silicon film making up a P-type polycrystal silicon film connected to the P$^+$-type source/drain region 9.

In the memory cell of the second embodiment, as shown in FIG. 12, a contact hole 21c interconnects P$^+$-type source/drain region outgoing lead 22c, N$^+$-type source/drain region outgoing lead 20e, the P$^+$-type source/drain region 9, and a leader 5b ranging from a first inverter to a second inverter. Each inverter is made of a driver transistor and a load transistor. This structure allows many lead layers to be connected in a narrow area with a minimum increase of process steps, which implements a semiconductor device capable of greater circuit integration than ever.

As illustrated in FIG. 12, VCC lead 22a is formed by the third-layer polycrystal silicon film, and ground lead 20c by the second-layer polycrystal silicon film. Because the VCC lead 22a and the ground lead 20c are formed by different layers and in an overlapping manner, they take up less area than if they were made from the same lead layer. This is also conducive to implementing a semiconductor device capable of large-scale circuit integration.

Figure 17:
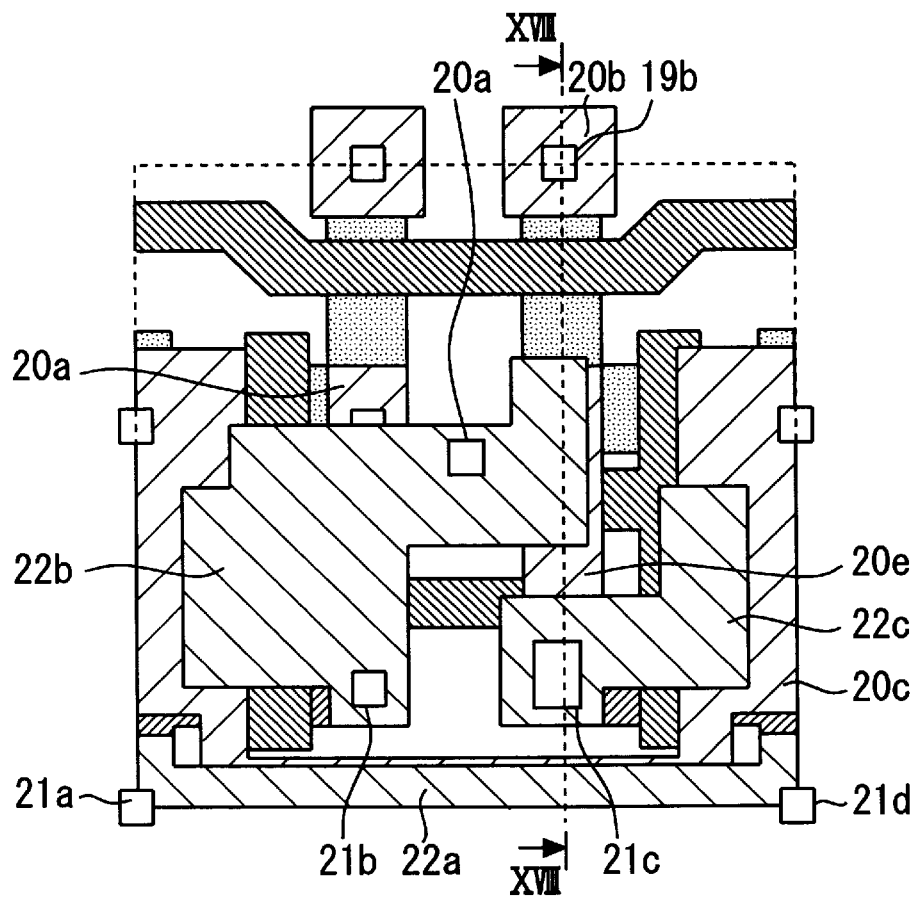

As shown in FIG. 17, capacitance arrangements are formed between the ground lead 20c and the P$^+$-type source/drain region outgoing lead 22b, between the ground line 20c and the P$^+$-type source/drain region outgoing lead 22c, and between the P$^+$-type source/drain region outgoing lead 22b and the N$^+$-type source/drain region outgoing lead 20e as in the case of the first embodiment. The structure increases the capacity of the memory nodes and stabilizes the High nodes thereof. This significantly enhances the resistance to soft errors as a benefit similar to that of the first embodiment.

In the second embodiment, PN diodes are formed by the second-layer N-type polycrystal silicon film and by the third-layer P-type polycrystal silicon film. This structure helps increase leak currents thanks to the presence of electron traps, hole traps and neutral traps produced in grain boundaries. Because currents flow even below the built-in potential level, the connection resistance is lowered as in the case of the first embodiment. This in turn facilitates the supply of charges to memory nodes and stabilizes the High nodes thereof, whereby the resistance to soft errors is boosted.

Figure 13:
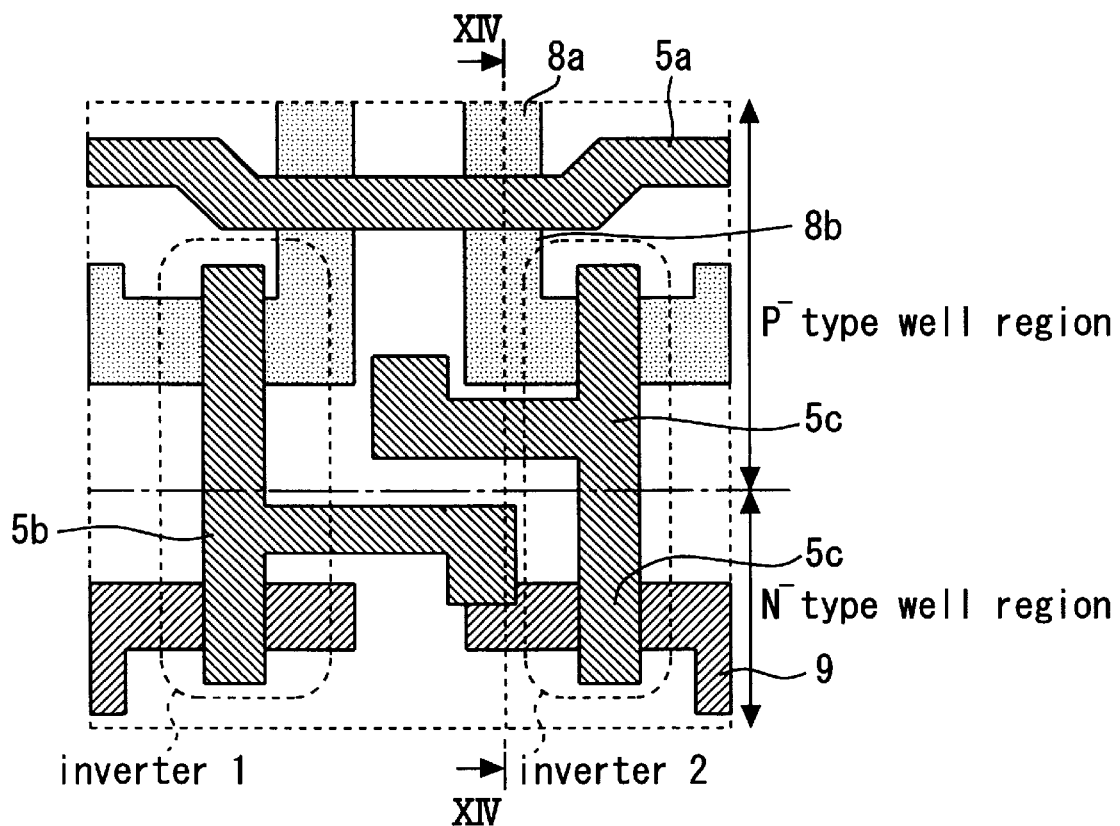
FIGS. 13 through 18 show a process of fabricating memory cells in the SRAM practiced as the second embodiment of the present invention.
Figure 14:
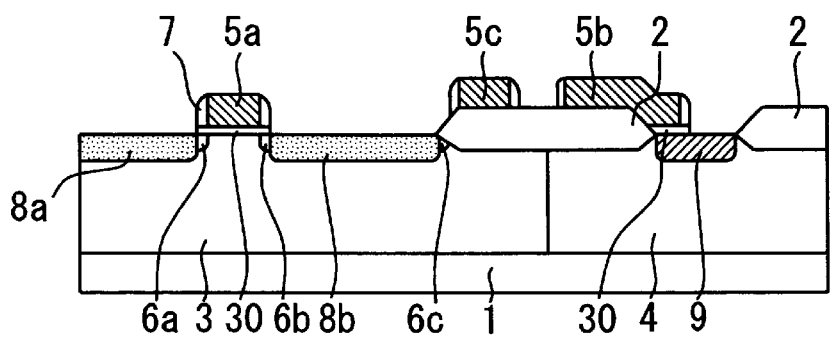
Figure 15:
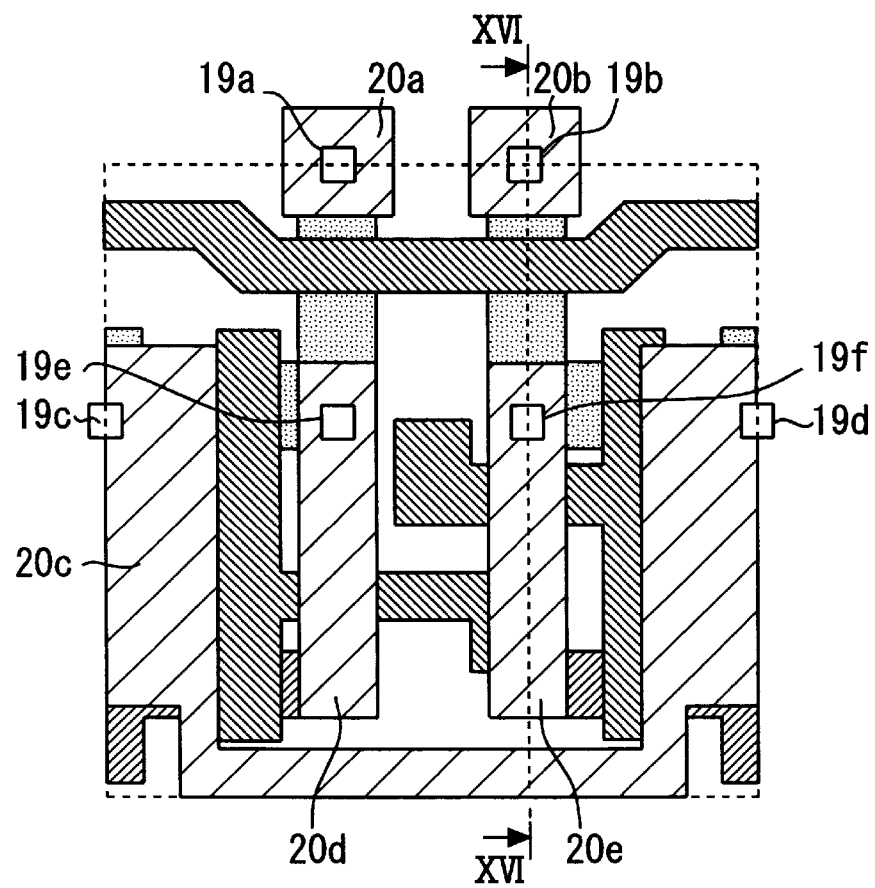
Figure 16:
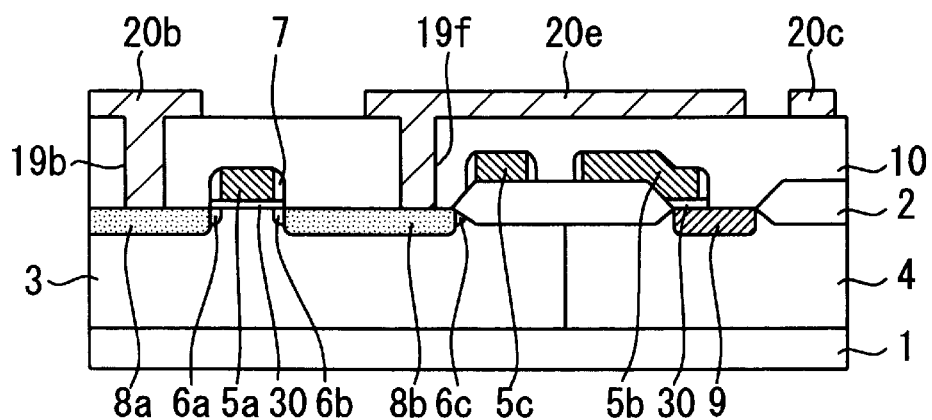
Figure 18:
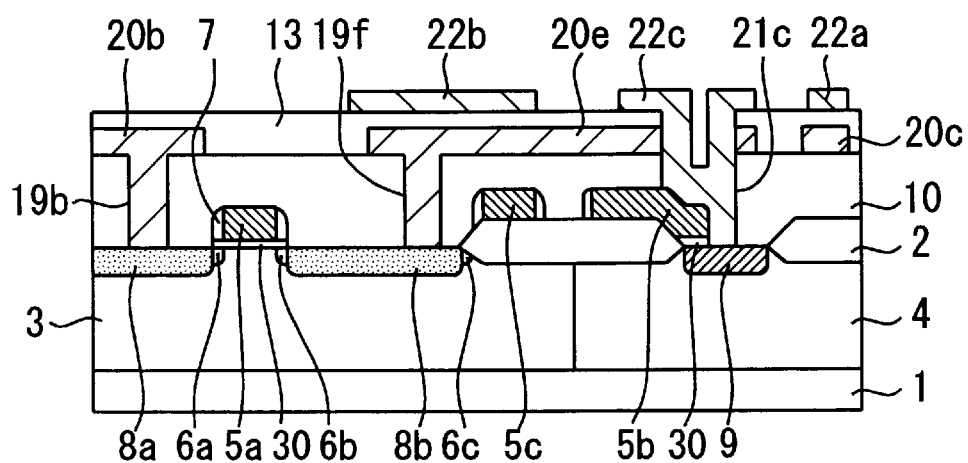

The process of fabricating memory cells in the SRAM practiced as the second embodiment will now be described with reference to FIGS. 13 through 18. FIGS. 13, 15 and 17 are a plan layout view of a memory cell each. FIGS. 14, 16 and 18 are cross-sectional views taken on line B—B in the respectively preceding layout views.

The process of fabricating the memory cells for the second embodiment is the same as that shown in FIGS. 5 and 6 for the first embodiment, up to the formation of the structure depicted in FIGS. 13 and 14. Thereafter, as illustrated in FIGS. 15 and 16, a silicon dioxide film 10 about 1,000 to 10,000 Å thick is deposited over the entire surface by LPCVD. The silicon dioxide film 10 is then patterned by photolithography and RIE to form contact holes 19a through 19f, whereby the N$^+$-type source/drain regions 8a and 8b are partially exposed.

A natural oxide film formed illustratively on the surface of the N$^+$-type source/drain regions 8a and 8b exposed inside the contact holes is removed using hydrofluoric acid (HF) or the like.

The LPCVD process is then used to form a phosphorus-doped polycrystal silicon film (not shown) constituting the second-layer polycrystal silicon film. The phosphorus-doped polycrystal silicon film is formed so that it has a thickness of about 200 to 2,000 Å and a phosphorus (P) density of about 1.0 to $8.0 \times 10^{20}$ cm$^{-3}$. This silicon film is then patterned by photolithography and RIE, whereby bit line contact pads 20a and 20b, ground lead 20c, and N$^+$-type source/drain region outgoing lead 20d and 20e are fabricated.

As shown in FIGS. 17 and 18, the LPCVD process is again used to form a silicon dioxide (SiO$_2$) film 13 about 1,000 to 10,000 Å thick over the entire surface. Selective removal of the silicon dioxide film 13 where appropriate by photo-lighography and RIE produces contact holes 21a through 21e partially exposing the P$^+$-type source/drain region 9. The contact hole 21c is formed so as to penetrate the N$^+$-type source/drain region outgoig lead 20e underneath, partially exposing the P$^+$-type source/drain region 9 and the leader 5b. The contact hole 21b is made so as to penetrate the N$^+$-type source/drain region outgoing lead 20d underneath, exposing the P$^+$-type source/drain region 9.

A natural oxide film formed over the top surface of the exposed P$^+$-type source/drain region 9 is removed by use of hydrofluoric acid (HF) or the like.

The LPCVD process is then used to deposit the third-layer polycrystal silicon film (not shown) about 200 to 2,000 Å thick. After its deposition, the polycrystal silicon film is patterned by photolithography and RIE. The patterning is followed by implantation of, say, BF$_2$ onto all over the third-layer polycrystal silicon films 22a, 22b and 22c in doses of about $1.0 \times 10^{14}$ cm$^{-2}$ to $5.0 \times 10^{15}$ cm$^{-2}$ at 20 KeV. Thereafter, boron in the third-layer polycrystal silicon films 22a through 22c is activated illustratively by use of lamp annealing. The third-layer polycrystal silicon film 22a forms the VCC lead. The films 22b and 22c constitute the P$^+$-type source/drain region outgoing lead.

Consequently, as shown in FIG. 12, the contact hole 21c interconnects the P$^+$-type source/drain region outgoing lead 22c, the N$^+$-type source/drain region outgoing lead 20e formed underneath, the P$^+$-type source/drain region 9, and the leader 5b made of the first-layer polycrystal silicon film.

As depicted in FIG. 17, the contact hole 21b interconnects the P$^+$-type source/drain region outgoing lead 22b, the N$^+$-type source/drain region outgoing lead 20d provided underneath, and the P$^+$-type source/drain region 9.

Thereafter, as shown in FIGS. 11 and 12, the LPCVD process is used to form an interlayer insulating film 16 by depositing an SiO$_2$ film about 3,000 to 10,000 Å thick over the entire surface, as in the case of the first embodiment. Contact holes 17a and 17d as well as bit line contact holes 17b and 17c are formed on the film thus produced. As metal lead, there is formed illustratively an aluminum film about 1,000 to 5,000 Å thick constituting ground lines 18a and 18d as well as bit lines 18b and 18c. The bit line contact hole 17c penetrating both the interlayer insulating film 16 and the silicon dioxide film 13 connects the bit line 18c to a bit line contact pad 20b formed by the second-layer polycrystal silicon film. The metal lead has a sheet resistance of about 0.05 to 1 Ω/□.

The processing above completes fabrication of the memory cells in the SRAM practiced as the second embodiment of the invention.

Third Embodiment

Figure 19:
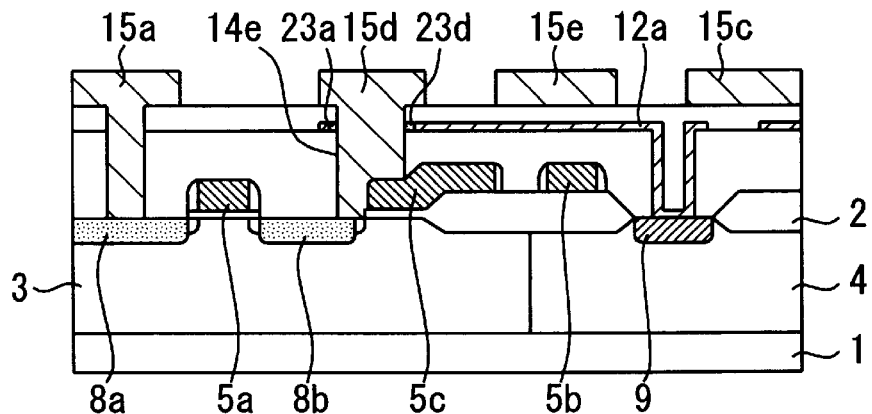
FIG. 19 is a cross-sectional view of a memory cell in an SRAM practiced as a third embodiment of the present invention.
Figure 20:
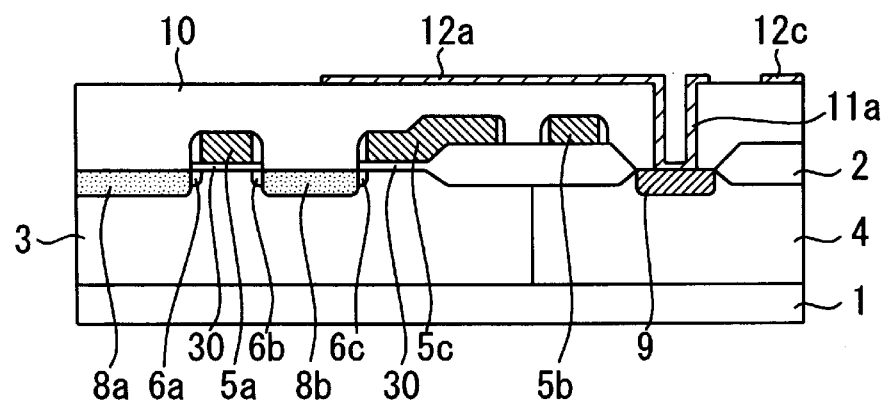
FIGS. 20 through 24 show a process of fabricating the memory cells of the SRAM practiced as the third embodiment of the present invention.

FIG. 19 is a cross-sectional view of a memory cell in an SRAM practiced as a third embodiment of the invention. FIG. 19 shows a cross-sectional view of the third embodiment in effect before bit lines and ground lead are formed. The third embodiment is basically the same in constitution as the first embodiment shown in FIG. 10. Differing from the first embodiment, the third embodiment has thin oxide films 23a and 23d provided in a contact interface between the N$^+$-type source/drain region outgoing lead 15d and the P$^+$-type source/drain region outgoing lead 12a. The provision of the thin oxide films 23a and 23d in the contact interface ensures low-resistance connection thanks to conductance by tunneling even if PN diodes are formed. This facilitates the supply of charges to memory nodes and thereby enhances the resistance to soft errors.

Figure 21:
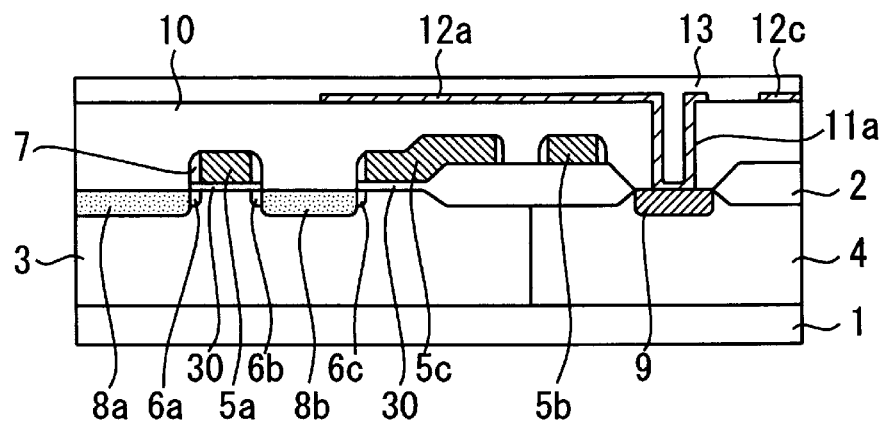
Figure 22:
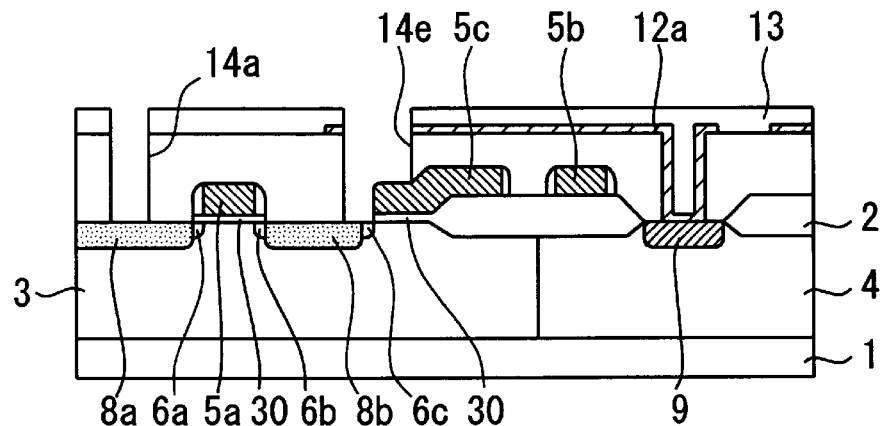

The process of fabricating the memory cells of the SRAM practiced as the third embodiment will now be described with reference to FIGS. 20 through 24. Initially, the same process as that in FIG. 8 for the first embodiment is used to proceed up to the makeup of FIG. 20. Then as shown in FIG. 21, a silicon dioxide film 13 about 100 to 1,000 Å thick is formed over the entire surface by the LPCVD process. With the silicon dioxide film thus formed, direct contact holes 14a through 14g are fabricated by photolithography and RIE as shown in FIG. 22.

Figure 23:
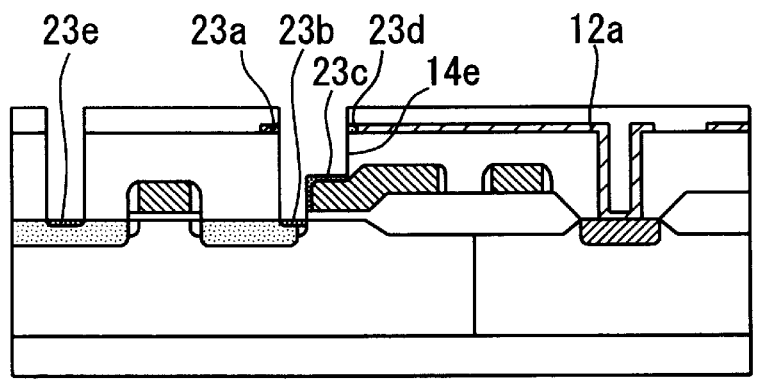
Figure 24:
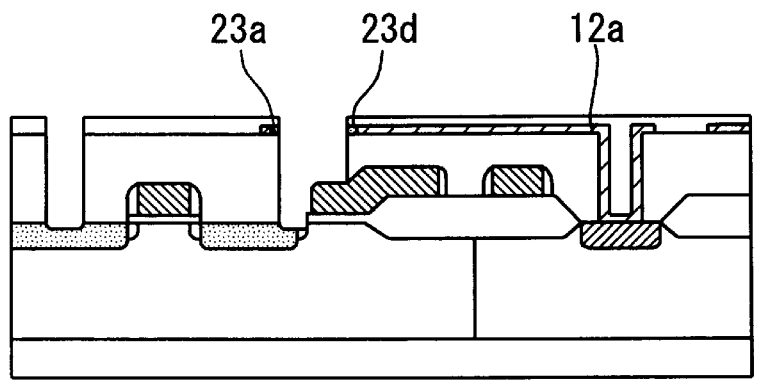

Thereafter, as depicted in FIG. 23, oxide films 23a through 23e are formed by oxidizing, through annealing in an oxygen atmosphere, those parts of the leader 5c, N$^+$-type source/drain region 8b, and P$^+$-type source/drain region outgoing lead 12a which are exposed in the direct contact hole 14e. The oxide films 23b, 23c and 23e thus formed are selectively removed by applying the anisotropic RIE process to the entire surface, as shown in FIG. 24.

After natural oxide films are removed by use of hydrofluoric acid (HF) or the like, the LPCVD process is employed to form a phosphorus-doped polycrystal silicon film (not shown) constituting the third-layer polycrystal silicon film. This phosphorus-doped polycrystal silicon film is formed so that it has a thickness of about 1,000 to 2,000 Å and a phosphorus (P) density of about 1.0 to $8.0 \times 10^{20}$ cm$^{-3}$. The silicon film is then patterned by photolithography and RIE as illustrated in FIG. 19. The patterning fabricates bit line contact pads 15a and 15b, ground lead 15c, and N$^+$-type source/drain region outgoing lead 15d and 15e. The third-layer polycrystal silicon film has a sheet resistance of about 10 to 100 Ω/□.

As a result, the direct contact hole 14e interconnects the N$^+$-type source/drain region outgoing lead 15d, the P$^+$-type source/drain region outgoing lead 12a, the N$^+$-type source/drain region 8b, and the leader 5c formed by the first-layer polycrystal silicon film. In addition, thin oxide films 23a and 23d are provided in a contact interface between the N$^+$-type source/drain region outgoing lead 15d and the P$^+$-type source/drain region outgoing lead 12a, the contact interface constituting connection lead between the drain regions of load transistors and those of driver transistors. The provision of the thin oxide films 23a and 23d ensures low-resistance connection based on the tunnel effect. The tunnel effect involves the appearance of conductance illustratively in an insulating film such as an oxide film subject to a high electrical field, the conductance being attributed to carriers getting injected into the oxide film. This facilitates the supply of charges to memory nodes and stabilizes the High nodes thereof, whereby the resistance to soft errors is enhanced. As with the first embodiment, the interlayer insulating film 16, bit lines and other elements are later formed to complete fabrication of the memory cells making up the SRAM practiced as the third embodiment of the invention.

Fourth Embodiment

Figure 25:
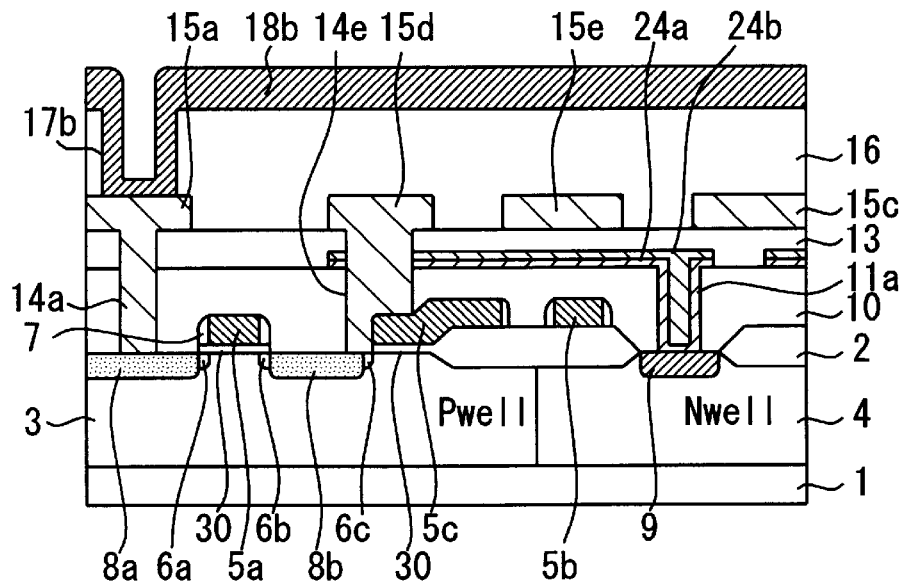
FIG. 25 is a cross-sectional view of a memory cell in an SRAM practiced as a fourth embodiment of the present invention.

FIG. 25 is a cross-sectional view of a memory cell in an SRAM practiced as a fourth embodiment of the invention. The fourth embodiment is basically the same in constitution as the first embodiment shown in FIG. 2. Differing from the first embodiment having the second-layer polycrystal silicon film, the fourth embodiment has so-called polycide lead made of a P-type polycrystal silicon film 24a and a metal silicide film 24b such as a tungsten silicide (WSi$_2$) film. In other words, the P$^+$-type source/drain region outgoing lead 12a in the first embodiment is replaced in the fourth embodiment by the polycide lead composed of the P-type polycrystal silicon film 24a and metal silicide film 24b.

In the above-described constitution of the fourth embodiment, the connection between the P+-type source/drain region 9 (drain region for load transistors) and the N+-type source/drain region 8b (drain region for driver transistors) is implemented not by a direct P-to-N contact but by a path through a metal silicide film (i.e., P-to-N connection via the metal silicide film and N-to-P connection via the same film). This arrangement ensures low-resistance connection that facilitates the supply of charges to memory nodes and stabilizes the High nodes thereof so as to enhance the resistance to soft errors.

Fifth Embodiment

Figure 26:
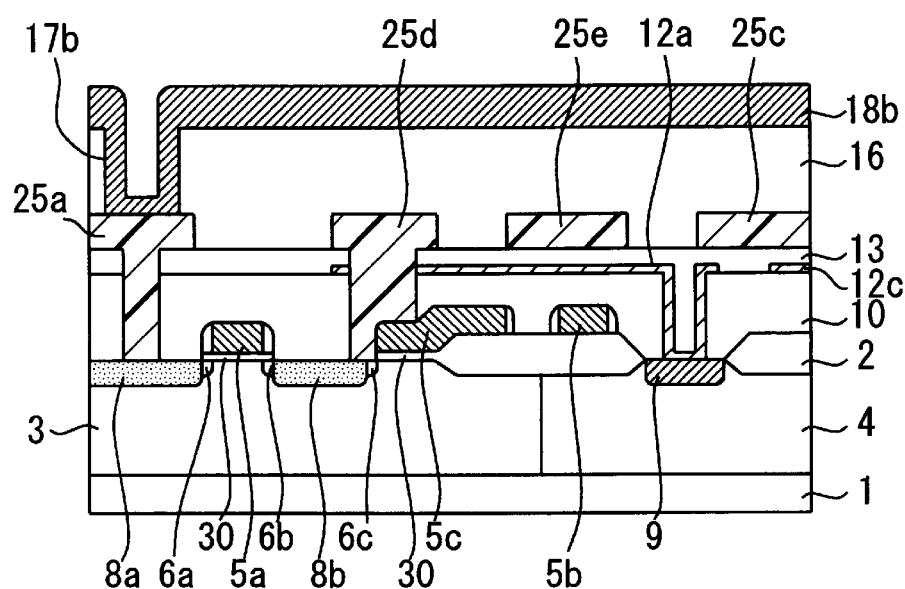
FIG. 26 is a cross-sectional view of a memory cell in an SRAM practiced as a fifth embodiment of the present invention.

FIG. 26 is a cross-sectional view of a memory cell in an SRAM practiced as a fifth embodiment of the invention. The fifth embodiment is basically the same in constitution as the first embodiment shown in FIG. 2. The difference is that the fifth embodiment has a metal lead arrangement replacing that lead in the first embodiment which is formed by the third-layer polycrystal silicon film. Of the metal lead arrangements in the fifth embodiment, reference numeral 25a and 25b stand for bit line contact pads, 25c denotes ground lead, and 25d and 25e represent N+-type source/drain region outgoing lead. The above constitution provides low-resistance connection that facilitates the supply of charges to memory nodes and stabilizes the High nodes thereof, thus enhancing the resistance to soft errors.

Sixth Embodiment

Figure 27:
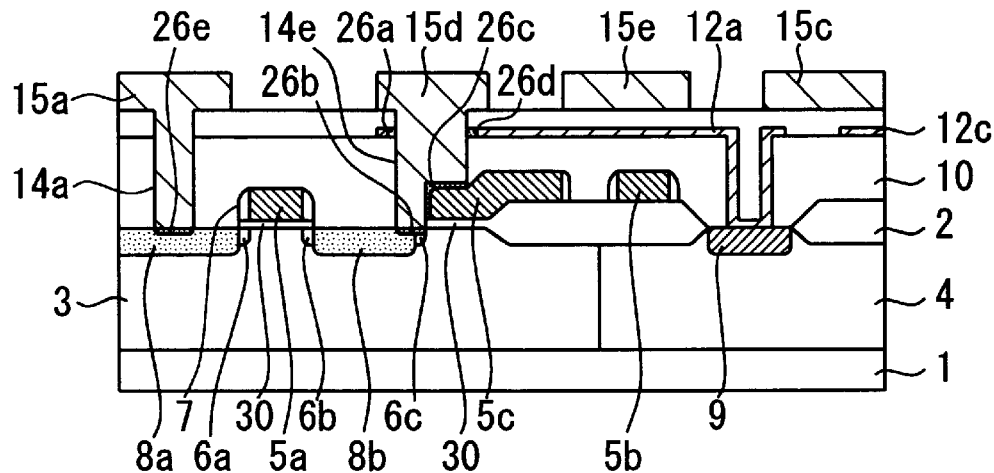
FIG. 27 is a cross-sectional view of a memory cell in an SRAM practiced as a sixth embodiment of the present invention.
Figure 28:
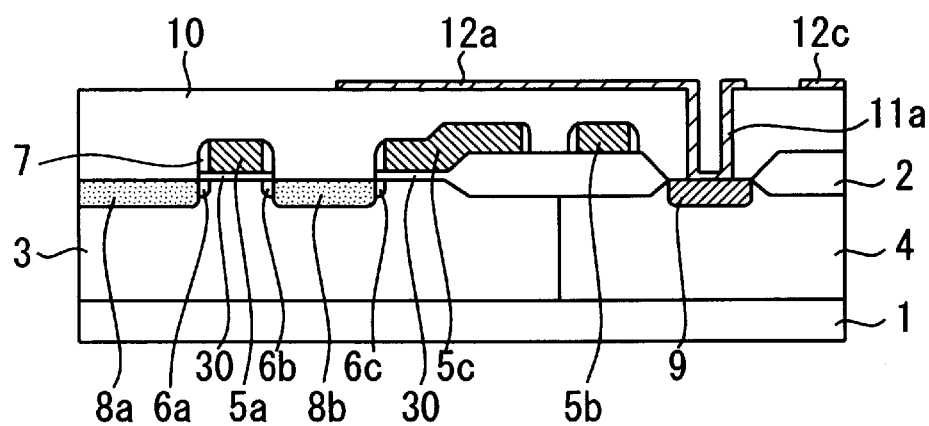
FIGS. 28 through 31 shows a process of fabricating the memory cells of the SRAM practiced as the sixth embodiment of the present invention.

FIG. 27 is a cross-sectional view of a memory cell in an SRAM practiced as a sixth embodiment of the invention. FIG. 27 shows a cross-sectional view of the sixth embodiment in effect before bit lines and ground lead are formed. The sixth embodiment is basically the same in constitution as the first embodiment shown in FIG. 10. Differing from the first embodiment, the sixth embodiment has thin titanium silicide films 26a and 26d provided in a contact interface between the N+-type source/drain region outgoing lead 15d and the P+-type source/drain region outgoing lead 12a, and also has titanium silicide films 26b and 26c formed in a contact interface between the leader 5c, N+-type source/drain region 8b and N−-type source/drain region 6c on the one hand, and the N+-type source/drain region outgoing lead 15d on the other hand. Furthermore, the sixth embodiment comprises a titanium silicide film 26e in a contact interface between the bit line contact pad 15a and the N+-type source/drain region 8a.

The provision of thin metal films in the contact interface provides low resistance connection. This facilitates the supply of charges to memory nodes and stabilizes the High nodes thereof, enhancing the resistance to soft errors.

Figure 29:
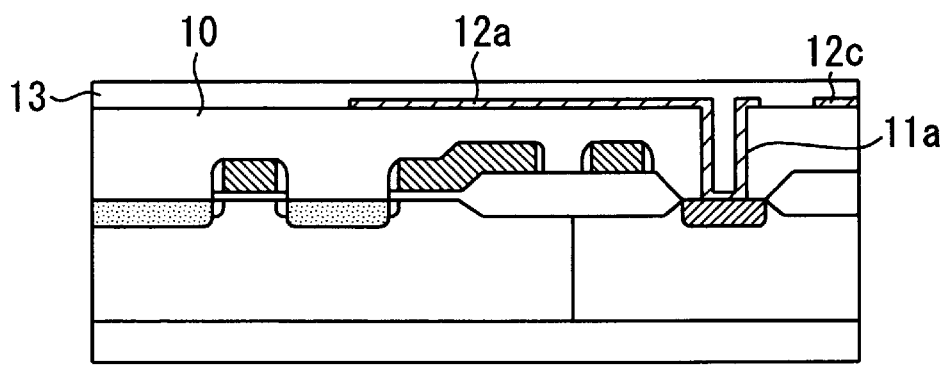
Figure 30:
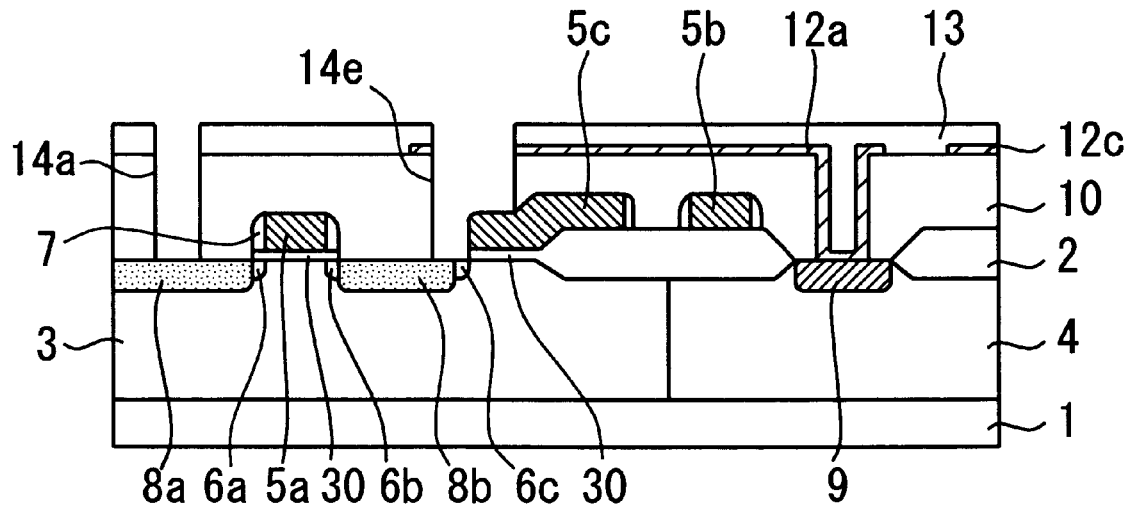

The process of fabricating the memory cells of the SRAM practiced as the sixth embodiment will now be described with reference to FIGS. 28 through 31. Initially, the same process as that in FIG. 8 for the first embodiment is used to proceed up to the makeup of FIG. 28. Then as shown in FIG. 29, a silicon dioxide film 13 about 100 to 1,000 thick is formed over the entire surface by the LPCVD process. With the silicon dioxide film thus formed, direct contact holes 14a through 14g are fabricated by photolithography and RIE as shown in FIG. 30.

Figure 31:
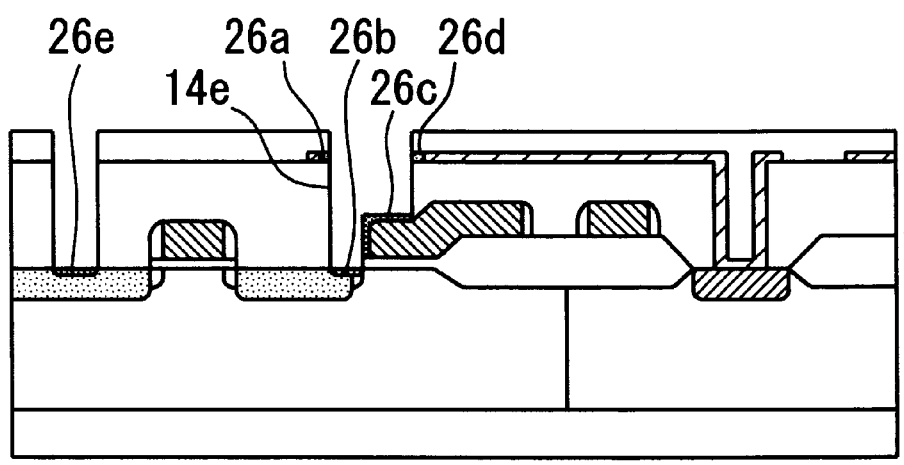
Figure 32:
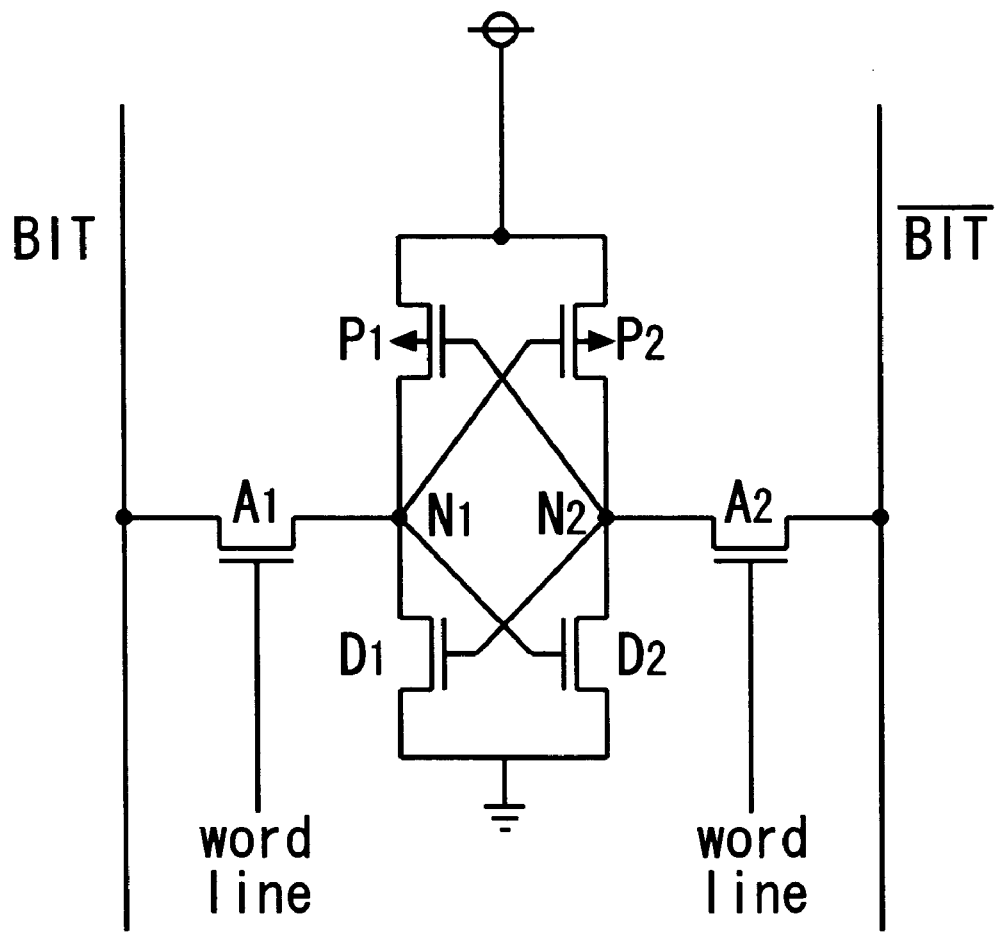
FIG. 32 is an equivalent circuit diagram showing a memory cell of a conventional SRAM.

Thereafter, as depicted in FIG. 31, a titanium film about 200 to 1,000 Å thick is illustratively formed over the entire surface by sputtering. The titanium film thus formed is subjected illustratively to lamp annealing for about 30 seconds at about 700 to 800° C. to produce titanium silicide ($TiSi_2$) over the exposed silicon surface. Later, a mixed solution of sulfuric acid and hydrogen peroxide is used to remove unreacted titanium from the surface. With the unreacted titanium eliminated, a 30-second annealing process at 700 to 900° C. is carried out to finish the titanium silicide into the films 26a through 26e.

In this manner, the titanium silicide films 26a through 26d are fabricated over those parts of the leader 5c, N+-type source/drain region 8b, and P+-type source/drain region outgoing lead 12a which are exposed in the direct contact hole 14e. The titanium silicide film 26e is also formed over the exposed part of the N+-type source/drain region 8a.

After natural oxide films are removed using hydrofluoric acid (HF) or the like, the LPCVD process is employed to form a phosphorus-doped polycrystal silicon film (not shown) constituting the third-layer polycrystal silicon film. This phosphorus-doped polycrystal silicon film is formed so that it has a thickness of about 1,000 to 2,000 Å and a phosphorus (P) density of about 1.0 to $8.0 \times 10^{20} cm^{-3}$. The silicon film is then patterned by photolithography and RIE. The patterning fabricates bit line contact pads 15a and 15b, ground lead 15c, and N+-type source/drain region outgoing lead 15d and 15e as depicted in FIG. 27. The third-layer polycrystal silicon film has a sheet resistance of about 10 to 100 Ω/□.

As with the first embodiment, the sixth embodiment has the interlayer insulating film 16, bit lines and other elements formed subsequently. This completes fabrication of the memory cells making up the SRAM practiced as the sixth embodiment.

As described, the sixth embodiment includes thin metal films in the contact interface between the drain regions of the load transistors and those of the driver transistors. The thin metal film arrangement provides low-resistance connection. This facilitates the supply of charges to memory nodes and stabilizes the High nodes thereof, enhancing the resistance to soft errors.

The features, effects and advantages of the present invention are summarized as follows.

As described, the semiconductor device according to the present invention has the second lead connected electrically to the second impurity region by way of the second through hole formed so as to penetrate the first insulating film, first lead and second insulating film. The connection of the first impurity region with the second impurity region is implemented by interconnecting the first lead, second lead and second impurity region inside the second through hole. This structure allows many lead layers to be connected in a narrow area with a minimum increase of process steps. The fact that either the first lead or the second lead is made of a polycrystal silicon film ensures reliable, heat-resistant connection, and permits further miniaturization because patterning is easier than with metal lead. These features are conducive to fabricating a semiconductor device capable of greater circuit integration than ever.

The other one of the first and the second lead may also be formed by a polycrystal silicon film. In that case, the embodiment of the invention provides reliable, heat-resistant connection. Because the patterning is made easier than with metal lead, the inventive constitution permits further miniaturization and is conducive to greater circuit integration than ever before.

The first lead and the first impurity region may have the p-type conductivity while the second lead and the second impurity region may have the n-type conductivity. In this structure, the first and the second lead are connected respectively to the first and the second impurity regions of the same conductivity. The structure prevents impurities of a given lead arrangement different in conductivity from its paired impurity region from diffusing into the latter. This in turn forestalls formation of ideal PN diodes in the semiconductor substrate, whereby the High nodes among the memory nodes are stabilized and the resistance to soft errors is enhanced.

The semiconductor device may be an SRAM wherein the first lead serves as the drain region outgoing lead for the load transistors and wherein the second lead acts as the drain region outgoing lead for the driver transistors. In this structure, the drain region outgoing lead for the load transistors (i.e., p-type first lead) and the drain region outgoing lead for the driver transistors (n-type second lead) are connected, whereby the p-type first impurity region and the n-type second impurity region are connected. This stabilizes the High nodes among the memory nodes and improves the resistance to soft errors.

In the inventive semiconductor device, the drain region outgoing lead for the first and the second load transistors and the ground lead may be formed in a three-dimensionally overlapping manner, with the second insulating film interposed therebetween; and the drain region outgoing lead for the first load transistors and the drain region outgoing lead for the second driver transistors may be formed also in a three-dimensionally overlapping manner, with the second insulating film interposed therebetween. This structure constitutes charge accumulators among the memory nodes and thereby increases the capacity of the latter. In turn, a drop in the charges of the memory nodes is forestalled and the High memory nodes are stabilized, which significantly boosts the resistance to soft errors.

The semiconductor device according to the present invention may further comprise the power lead fabricated in the same process as that of the first lead, wherein the power lead and the ground lead are formed in a three-dimensionally overlapping manner. In this structure, the power lead and ground lead take up less area than if they were made from the same lead layer. This is conducive to implementing a semiconductor device capable of large-scale circuit integration.

The semiconductor device of the present invention may further comprise a thin oxide film in the contact interface between the first lead and the second lead. The thin oxide film arrangement reduces connection resistance of the first and the second lead. This facilitates the supply of charges to memory nodes, stabilizes the High nodes among the memory nodes and thereby improves the resistance to soft errors.

The inventive semiconductor device may further comprise a thin metal film in the contact interface between the first lead and the second lead. The thin metal film arrangement reduces connection resistance of the first and the second lead. This also facilitates the supply of charges to memory nodes, stabilizes the High memory nodes and thereby improves the resistance to soft errors.

In the semiconductor device of the present invention, the first lead may be constituted by a composite film made of a high melting-point metal film and a polycrystal silicon film. That is, the connection between the first and the second lead is implemented not by a direct p-to-n contact but by a path of the metal film arrangement. This reduces connection resistance, facilitates the supply of charges to memory nodes, stabilizes the High memory nodes, and improves the resistance to soft errors.

In the inventive semiconductor device, the second lead may be constituted by metal lead. The metal lead arrangement reduces connection resistance and facilitates the supply of charges to memory nodes. This in turn stabilizes the High memory nodes and improves the resistance to soft errors.

The first lead and the first impurity region may have the n-type conductivity while the second lead and the second impurity region may have the p-type conductivity. In this structure, the first and the second lead are connected respectively to the first and the second impurity regions of the same conductivity. The structure prevents impurities of a given lead arrangement different in conductivity from its paired impurity region from diffusing into the latter. This in turn forestalls formation of ideal PN diodes in the semiconductor substrate, whereby the High nodes among the memory nodes are stabilized and the resistance to soft errors is enhanced.

The semiconductor device according to the present invention may be an SRAM wherein the first lead serves as drain region outgoing lead for the driver transistors and wherein the second lead acts as drain region outgoing lead for the load transistors. In this structure, the drain region outgoing lead for the load transistors (i.e., n-type first lead) and the drain region outgoing lead for the driver transistors (p-type second lead) are connected, whereby the n-type first impurity region and the p-type second impurity region are connected. This stabilizes the High nodes among the memory nodes and improves the resistance to soft errors.

In the inventive semiconductor device, the ground lead and the drain region outgoing lead for the first and the second load transistors may be formed in a three-dimensionally overlapping manner, with the second insulating film interposed therebetween; and the drain region outgoing lead for the second driver transistors and the drain region outgoing lead for the first load transistors may be formed in a three-dimensionally overlapping manner, with the second insulating film interposed therebetween. This structure constitutes charge accumulators among the memory nodes and thereby increases the capacity of the latter. As a result, a drop in the charges of the memory nodes is forestalled and the High memory nodes are stabilized, which significantly boosts the resistance to soft errors.

The semiconductor device according to the present invention may further comprise the power lead fabricated in the same process as that of the second lead, wherein the power lead and the ground lead are formed in a three-dimensionally overlapping manner. In this structure, the power lead and ground lead take up less area than if they were made from the same lead layer. This is conducive to implementing a semiconductor device capable of large-scale circuit integration.

The semiconductor device fabrication method according to the present invention comprises the steps of: forming on the first insulating film the first lead connected electrically to the first impurity region via the first through holes formed on the first insulating film; forming the second insulating film so as to cover the first lead; forming the second through holes penetrating the first insulating film, the first lead and the second insulating film, the second through holes reaching a surface of the second impurity region; and forming on the second insulating film the second lead connected electrically to the second impurity region via the second through holes. In fabricating the semiconductor device, the inventive method allows many lead layers to be connected in a narrow area with a minimum increase of process steps, whereby a semiconductor device capable of large-scale circuit integration is implemented.

The inventive semiconductor device fabrication method may further comprise the steps of forming a titanium film on a surface which includes the first lead and which is exposed as a result of the formation of the second through holes, and forming titanium silicide by annealing the titanium film. In fabricating the semiconductor device, the method reduces connection resistance of the first and the second lead, This facilitates the supply of charges to memory nodes, stabilizes the High nodes thereof and enhances the resistance to soft errors.

Obviously many modifications and variations of the present invention are possible in the light of the above teachings. It is therefore to be understood that within the scope of the appended claims the invention may by practiced otherwise than as specifically described.

What is claimed is:

1. A semiconductor device having six transistors including first and second load transistors, first and second driver transistors and first and second access transistors, and having a lead connection structure wherein at least two lead layers are electrically interconnected via contact holes, said semiconductor device comprising:

a semiconductor substrate having a principal plane;

a first and a second impurity region having opposite conductivities formed on said principal plane of said semiconductor substrate;

a first insulating film which is formed on said first and second impurity regions and which has a first through hole reaching a surface of said first impurity region;

first lead formed on said first insulating film and connected electrically via said first through hole to said first impurity region to form a drain region outgoing lead for two of said six transistors;

a second insulating film formed so as to cover said first lead; and a second lead formed on said second insulating film, said second lead being electrically connected to said second impurity region via a second through hole penetrating said first insulating film, said first lead and said second insulating film to form a drain region outgoing lead for two of said six transistors;

wherein interconnection of said first and said second impurity regions is accomplished by connecting said first lead, said second lead and said second impurity region inside said second through hole; and wherein one of said first lead and said second lead is constituted by a polycrystal silicon film.

2. The semiconductor device according to claim 1, wherein the other one of said first lead and said second lead is constituted by a polycrystal silicon film.

3. The semiconductor device according to claim 1, wherein said first lead and said first impurity region have a p-type conductivity, and said second lead and said second impurity region have an n-type conductivity.

4. The semiconductor device according to claim 3, wherein said first lead serves as drain region outgoing lead for said first and said second load transistors, and said second lead acts as drain region outgoing lead for said first and said second driver transistors.

5. The semiconductor device according to claim 4, wherein said second lead further includes a ground lead, said ground lead being fabricated on said second insulating film in the same process as that of said drain region outgoing lead for said first and second driver transistors;

wherein said drain region outgoing lead for said first and said second load transistors and said ground lead are formed in a three-dimensionally overlapping manner, with said second insulating film interposed therebetween; and wherein said drain region outgoing lead for said first load transistors and said drain region outgoing lead for said second driver transistors are formed in a three-dimensionally overlapping manner with said second insulating film interposed therebetween.

6. The semiconductor device according to claim 5, wherein said first lead further includes a power lead, said power lead being fabricated in the same process as that of said drain region outgoing lead for said first and second load transistors, and wherein said power lead and said ground lead are formed in a three-dimensionally overlapping manner.

7. The semiconductor device according to claim 3, further comprising a thin oxide film in a contact interface between said first lead and said second lead.

8. The semiconductor device according to claim 3, further comprising a thin metal film in a contact interface between said first lead and said second lead.

9. The semiconductor device according to claim 1, wherein said first lead serves as drain region outgoing lead for said first and said second load transistors, and said second lead acts as drain region outgoing lead for said first and said second driver transistors.

10. The semiconductor device according to claim 9, wherein said second lead further includes a ground lead, said ground lead being fabricated on said second insulating film in the same process as that of said drain region outgoing lead for said first and second driver transistors;

wherein said drain region outgoing lead for said first and said second load transistors and said ground lead are formed in a three-dimensionally overlapping manner, with said second insulating film interposed therebetween; and wherein said drain region outgoing lead for said first load transistors and said drain region outgoing lead for said second driver transistors are formed in a three-dimensionally overlapping manner, with said second insulating film interposed therebetween.

11. The semiconductor device according to claim 1, wherein said first lead is constituted by a composite film made of a high melting-point metal film and a polycrystal silicon film.

12. The semiconductor device according to claim 1, wherein said second lead is constituted by metal lead.

13. The semiconductor device according to claim 1, wherein said first lead and said first impurity region have an n-type conductivity, and said second lead and said second impurity region have a p-type conductivity.

14. The semiconductor device according to claim 13, wherein said first lead serves as drain region outgoing lead for said first and said second driver transistors, and said second lead acts as drain region outgoing lead for said first and said second load transistors.

15. The semiconductor device according to claim 14, wherein said first lead further includes a ground lead, said ground lead being fabricated on said first insulating film in the same process as that of said drain region outgoing lead for said first and second driver transitors;

wherein said ground lead and said drain region outgoing lead for said first and said second load transistors are formed in a three-dimensionally overlapping manner, with said second insulating film interposed therebetween; and wherein said drain region outgoing lead for said second driver transistors and said drain region outgoing lead for said first load transistors are formed in a three-dimensionally overlapping manner, with said second insulating film interposed therebetween.

16. The semiconductor device according to claim 15, wherein said second lead further includes a power lead, said power lead being fabricated in the same process as that of said drain region outgoing lead for said first and second load transistors, said power lead and said ground lead being formed in a three-dimensionally overlapping manner.

17. The semiconductor device according to claim 1,
   wherein said first lead serves as drain region outgoing lead for said first and said second driver transistors, and said second lead acts as drain region outgoing lead for said first and said second load transistors.

18. The semiconductor device according to claim 17, wherein said first lead further includes a ground lead, said ground lead being fabricated on said first insulating film in the same process as that of said drain region outgoing lead for said first and second driver transistors;
   wherein said ground lead and said drain region outgoing lead for said first and said second load transistors are formed in a three-dimensionally overlapping manner, with said second insulating film interposed therebetween; and
   wherein said drain region outgoing lead for said second driver transistors and said drain region outgoing lead for said first load transistors are formed in a three-dimensionally overlapping manner, with said second insulating film interposed therebetween.

* * * * *